United States Patent
Zhu et al.

(10) Patent No.: US 10,109,481 B2
(45) Date of Patent: Oct. 23, 2018

(54) ALUMINUM-NITRIDE BUFFER AND ACTIVE LAYERS BY PHYSICAL VAPOR DEPOSITION

(71) Applicant: Applied Materials, Inc., Santa Clara, CA (US)

(72) Inventors: Mingwei Zhu, Sunnyvale, CA (US); Nag B. Patibandla, Pleasanton, CA (US); Rongjun Wang, Dublin, CA (US); Vivek Agrawal, Fremont, CA (US); Anantha Subramani, San Jose, CA (US); Daniel Lee Diehl, Chiba (JP); Xianmin Tang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/410,790

(22) PCT Filed: Jul. 1, 2013

(86) PCT No.: PCT/US2013/048879
§ 371 (c)(1),
(2) Date: Dec. 23, 2014

(87) PCT Pub. No.: WO2014/008162
PCT Pub. Date: Jan. 9, 2014

(65) Prior Publication Data
US 2015/0348773 A1    Dec. 3, 2015

Related U.S. Application Data

(60) Provisional application No. 61/683,652, filed on Aug. 15, 2012, provisional application No. 61/667,339, filed on Jul. 2, 2012.

(51) Int. Cl.
*H01L 21/02* (2006.01)
*H01L 21/3065* (2006.01)
(Continued)

(52) U.S. Cl.
CPC ...... *H01L 21/0254* (2013.01); *C23C 14/0036* (2013.01); *C23C 14/0641* (2013.01);
(Continued)

(58) Field of Classification Search
CPC ........... H01L 21/0254; H01L 21/02458; H01L 21/02631; H01L 21/3065; H01J 37/3426;
(Continued)

(56) References Cited

U.S. PATENT DOCUMENTS 5,308,950 A * 5/1994 Ramm ................ C23C 14/022
156/345.44
6,168,690 B1    1/2001 Jewett et al.
(Continued)

FOREIGN PATENT DOCUMENTS

CN    101689592 A    3/2010
JP    2001-316812 A    11/2001
(Continued)

OTHER PUBLICATIONS

Chinese Office Action (with attached English Summary of Office Action) for Application No. 201380035434.9; dated Apr. 20, 2016; 17 total pages.
(Continued)

*Primary Examiner* — Brigitte Paterson

(57) ABSTRACT

Embodiments of the invention described herein generally relate to an apparatus and methods for forming high quality buffer layers and Group III-V layers that are used to form a useful semiconductor device, such as a power device, light emitting diode (LED), laser diode (LD) or other useful device. Embodiments of the invention may also include an
(Continued)

apparatus and methods for forming high quality buffer layers, Group III-V layers and electrode layers that are used to form a useful semiconductor device. In some embodiments, an apparatus and method includes the use of one or more cluster tools having one or more physical vapor deposition (PVD) chambers that are adapted to deposit a high quality aluminum nitride (AlN) buffer layer that has a high crystalline orientation on a surface of a plurality of substrates at the same time.

16 Claims, 9 Drawing Sheets

(51) Int. Cl.
    *H01L 21/322*    (2006.01)
    *H01J 37/34*    (2006.01)
    *C23C 14/00*    (2006.01)
    *C23C 14/06*    (2006.01)

(52) U.S. Cl.
    CPC ...... *H01J 37/3426* (2013.01); *H01J 37/3467* (2013.01); *H01L 21/02458* (2013.01); *H01L 21/02631* (2013.01); *H01L 21/3065* (2013.01); *H01L 21/3228* (2013.01)

(58) Field of Classification Search
    CPC ............. H01J 37/3467; C23C 14/0641; C23C 14/0036
    See application file for complete search history.

(56) References Cited

U.S. PATENT DOCUMENTS

| | | | | |
|---|---|---|---|---|
| 8,575,819 | B1* | 11/2013 | Bhugra | H03H 9/173 310/317 |
| 2001/0008205 | A1 | 7/2001 | Wilke et al. | |
| 2004/0188241 | A1* | 9/2004 | Rich | C23C 14/0617 204/192.12 |
| 2006/0016396 | A1 | 1/2006 | Kuh et al. | |
| 2009/0142870 | A1* | 6/2009 | Miki | C23C 14/0036 438/46 |
| 2009/0184381 | A1* | 7/2009 | Takizawa | G01N 5/02 257/414 |
| 2010/0209622 | A1 | 8/2010 | Satoh et al. | |
| 2010/0327311 | A1 | 12/2010 | Kaji et al. | |
| 2011/0049510 | A1* | 3/2011 | Yamazaki | H01L 27/1225 257/43 |
| 2011/0204417 | A1* | 8/2011 | Sato | H01L 21/78 257/190 |
| 2011/0244617 | A1* | 10/2011 | Su | C23C 16/301 438/46 |
| 2012/0112188 | A1* | 5/2012 | Yokoyama | H01L 21/0242 257/51 |
| 2012/0135212 | A1* | 5/2012 | Chang | C23C 14/0617 428/216 |
| 2012/0266819 | A1* | 10/2012 | Sanchez | C23C 16/4412 118/719 |
| 2012/0276407 | A1* | 11/2012 | Chang | C23C 14/022 428/623 |
| 2013/0029096 | A1* | 1/2013 | Chang | C23C 14/0015 428/141 |
| 2013/0049064 | A1 | 2/2013 | Daigo et al. | |

FOREIGN PATENT DOCUMENTS

| | | |
|---|---|---|
| JP | 2006-32524 A | 2/2006 |
| JP | 4714322 B2 | 4/2011 |
| KR | 2006-0008090 A | 1/2006 |
| WO | 2009/096270 A1 | 8/2009 |
| WO | 2011/136016 A1 | 11/2011 |

OTHER PUBLICATIONS

International Search Report and Written Opinion, PCT/US2013/048879, dated Sep. 27, 2013.
Chinese Office Action dated Sep. 28, 2016, filed in Chinese counterpart Application No. 201380035434.9, 5 pages (with translation).
Japanese Office Action dated Apr. 4, 2017, for Application No. 2015-520613.

* cited by examiner

US 10,109,481 B2

ALUMINUM-NITRIDE BUFFER AND ACTIVE LAYERS BY PHYSICAL VAPOR DEPOSITION

BACKGROUND OF THE INVENTION

Field of the Invention

Embodiments of the present invention generally relate to methods and hardware used to manufacture Group III-V containing devices, such as power devices, light emitting diodes (LEDs) and laser diodes (LDs).

Description of the Related Art

Group III-V materials are finding greater importance in the development and fabrication of a variety of semiconductor devices, such as power devices, including high power, high frequency, high temperature transistors and integrated circuits, LEDs or LDs. Group III-V materials are also playing an ever increasing role in the semiconductor and related industries. Often, group III-V materials are difficult to grow or deposit on foreign substrates (known as heteroepitaxy) without the formation of crystalline defects or cracks. The inclusion of one or more interfacial layers, or buffer layers, that are disposed between a surface of a substrate and a device layer provides many advantages in reducing defects and/or improving device functionality. However, the formation of high quality group III-V containing layers is challenging and are often very sensitive to process conditions of the deposition process. Avoiding interaction of a sensitive group III-V film with potential damaging conditions, however, is also not straightforward in many applications.

FIG. 1 illustrates an example of a conventional power semiconductor device 10 that includes a group III-nitride based heterojunction 15 disposed over a substrate 12. Heterojunction 15 includes a first III-nitride semiconductor layer 14, and a second III-nitride semiconductor layer 16 over first III-nitride semiconductor layer 14. A first power electrode 18 (i.e. source electrode) and a second power electrode 20 (i.e. drain electrode) are electrically connected to the first and second III-nitride semiconductor layers through a direct ohmic connection or any other suitable means. A gate structure 22 is disposed between first power electrode 18 and second power electrode 20 over second III-nitride semiconductor body 14. Gate structure 22 may include gate electrode 23 which is connected to second III-nitride semiconductor layer 16. Alternatively, gate structure 22 may include a Schottky type gate electrode connected to second III-nitride semiconductor body 16. In most conventional configurations, the first III-nitride semiconductor layer 14 may be a gallium nitride (GaN) layer and the second III-nitride semiconductor layer 16 may be an aluminum gallium nitride (AlGaN), which are disposed over a substrate 12 that is formed from a sapphire material. In some configurations the insulation layer 25 may contain silicon nitride (SiN) and the first power electrode 18, second power electrode 20 and the gate electrode 23 all comprise a metal containing layer.

One method that has been used for depositing Group III-nitrides, such as GaN, to form the active layers of a power device, LED or LD device is metal organic chemical vapor deposition (MOCVD) or hydride vapor phase epitaxy (HVPE). These deposition methods are generally performed in a reactor having a temperature controlled environment to assure the stability of precursor gases, which contains at least one element from Group III. The precursor gases are injected into a processing zone within the reactor, where they mix and move towards a heated substrate in the processing zone. A carrier gas may be used to assist in the transport of the precursor gases towards the substrate. The precursor gases react at the surface of the heated substrate to form a Group III-nitride layer, such as GaN, on the substrate surface. The quality of the film depends in part upon quality of the deposited film at the interfacial region of the deposited layer and the substrate, the properties of the deposited film, the cleanliness of the substrate surface and type of material from which the substrate is formed.

While the feasibility of using GaN to form part of a power device, LED device or LD device has been known for decades, there were numerous technical barriers that impeded their practical fabrication. For example, material differences between the sapphire or silicon substrate and Group III-nitride layers, such as the lattice constant, thermal expansion coefficient, surface contamination on the substrate surface 12A and interfacial surface energy, may create dislocations that may propagate through the formed structure and degrade the formed device's performance. Various types of buffer layers have been used in between the substrate and the Group III-nitride layer to modify the surface energy of the underlying substrate, alleviate the intrinsic stress within the lattice-matched nitride layers, and provide nucleation sites for epitaxial growth of the subsequent layers. However, the quality of conventional Group III-nitrides is generally not well controlled which may lead to unsatisfactory film properties (e.g., thickness variation, nuclei density, nuclei size, etc.) and device performance. Any slight changes in growth parameters during the nucleation could easily affect the subsequent nitride layer quality, which in turn leads to twist or mis-alignment of nucleation islands before they coalescence, thereby adversely affecting the growth of the subsequently deposited bulk Group III nitrides used to form the active parts, such as the group III-nitride based heterojunction 15, of the formed device.

As the demand for power devices, LEDs, LDs, transistors, and integrated circuits increases, the task of depositing high quality Group III-nitride films takes on greater importance. Therefore, there is a need for a process and apparatus that can form a high quality buffer layer that promotes the growth of a low defect density high quality Group-III nitride layers over a substrate.

SUMMARY OF THE INVENTION

Embodiments of the invention described herein generally relate to apparatus and methods for forming high quality buffer layers and Group III-V layers that are used to form a useful semiconductor device, such as a power device, light emitting diode (LED), laser diode (LD) or other useful device. In one embodiment, the apparatus and method include the use of one or more cluster tools having one or more physical vapor deposition (PVD) chambers that are adapted to deposit a high quality aluminum nitride (AlN) buffer layer that has a high crystalline orientation on a surface of a plurality of substrates at the same time. In one such embodiment, one or more AlN buffer layers are formed to have an atomically smooth surface with a roughness less than approximately 1 nanometer (nm) (root mean square (rms)) and a desirable crystalline orientation in the (002) direction (as verified by XRD diffraction (FWHM of (002) peak <200 arcsec using a sapphire substrate)). In another embodiment, one or more AlN buffer layers are formed to have an atomically smooth surface with a roughness less than approximately 2 nm (rms) for a 25 nm thick deposited layer and a desirable crystalline orientation in the (002) direction (as verified by XRD diffraction (FWHM of (002)

peak <3600 arcsec using a silicon substrate)). In some configurations, the roughness is less than about 3% of the thickness of the deposited layer. In one embodiments, the deposited AlN film thicknesses are less than approximately 500 nanometers.

In one embodiment, a method for fabricating a device, comprises removing a material from a surface of one or more substrates in a first processing chamber, transferring the one or more substrates from the first processing chamber to a second processing chamber in a controlled environment, forming an aluminum-nitride layer on the one or more substrates in a second processing chamber that has one or more walls that define a processing region, wherein forming the aluminum-nitride layer comprises biasing a target that has a surface that is in contact with the processing region, wherein the target comprises aluminum, flowing a first gas that comprises nitrogen into the processing region, flowing a second gas into the processing region, wherein the second gas comprises argon, krypton or neon, and biasing an electrode to form a potential on the one or more substrates that are disposed over a substrate support, wherein biasing the target and biasing the electrode are configured to promote N-face growth of the aluminum-nitride layer on the one or more substrates, and transferring the one or more substrates from the second processing chamber to a third processing chamber, and forming a group III-nitride layer on the aluminum nitride layer in the third processing chamber, wherein forming the group III-nitride layer comprises delivering a metal containing precursor and a nitrogen containing gas to a surface of each the one or more substrates. In some cases, removing the material comprises degassing the one or more substrates or sputter etching a surface of the one or more substrates, biasing the target comprises delivering a pulsed DC signal or an RF signal at a power between about 500 Watts and about 20 kWatts, and biasing the electrode comprises creating a floating potential on the one or more substrates that varies from between about −1000 volts and about +500 volts, and the method further comprises heating the one or more substrates to a temperature between about 200° C. and about 1000° C. before biasing the target, controlling a pressure with the processing while biasing the target to a pressure between about 0.1 mTorr and 200 mTorr, and depositing the AlN layer at a deposition rate between about 0.2 angstroms per second and about 20 angstroms per second.

In one embodiment, a method for fabricating a device, comprises removing a material from a surface of one or more substrates in a first processing chamber, transferring the one or more substrates from the first processing chamber to a second processing chamber in a controlled environment, forming an aluminum-nitride layer on the one or more substrates in a second processing chamber that has one or more walls that define a processing region, wherein forming the aluminum-nitride layer comprises biasing a target that has a surface that is in contact with the processing region, wherein the target comprises aluminum, flowing a first gas that comprises nitrogen into the processing region, and flowing a second gas into the processing region, wherein biasing the target is configured to promote N-face growth of the aluminum-nitride layer on the one or more substrates. Forming the aluminum-nitride layer may further comprise biasing an electrode to form a potential on the one or more substrates that are disposed over a substrate support, wherein biasing an electrode comprises biasing the electrode for a first period of time that occurs before and/or after biasing the target.

In one embodiment, a method for fabricating a device, comprises removing a material from a surface of one or more substrates in a first processing chamber, transferring the one or more substrates from the first processing chamber to a second processing chamber in a controlled environment, forming an aluminum-nitride layer on the one or more substrates in a second processing chamber that has one or more walls that define a processing region, wherein forming the aluminum-nitride layer comprises biasing a target that has a surface that is in contact with the processing region, wherein the target comprises aluminum, flowing a first gas that comprises nitrogen into the processing region, and flowing a second gas into the processing region, wherein biasing the target is configured to promote Al-face growth of the aluminum-nitride layer on the one or more substrates. Forming the aluminum-nitride layer may further comprise biasing an electrode to form a potential on the one or more substrates that are disposed over a substrate support, wherein biasing an electrode comprises biasing the electrode for a first period of time that occurs before and/or after biasing the target.

In another embodiment, a method for fabricating a device, comprises removing a material from a surface of one or more substrates in a first processing chamber, transferring the one or more substrates from the first processing chamber to a second processing chamber in a controlled environment, forming an aluminum-nitride layer on the one or more substrates in a second processing chamber that has one or more walls that define a processing region, wherein forming the aluminum-nitride layer comprises biasing a target that has a surface that is in contact with the processing region, wherein the target comprises aluminum, flowing a first gas that comprises nitrogen into the processing region, flowing a second gas into the processing region, wherein the second gas comprises argon, krypton or neon, and biasing an electrode to form a potential on the one or more substrates that are disposed over a substrate support, wherein biasing the target and biasing the electrode are configured to promote Al-face growth of the aluminum-nitride layer on the one or more substrates, and transferring the one or more substrates from the second processing chamber to a third processing chamber, and forming a group III-nitride layer on the aluminum nitride layer in the third processing chamber, wherein forming the group III-nitride layer comprises delivering a metal containing precursor and a nitrogen containing gas to a surface of each the one or more substrates.

In yet another embodiment, an apparatus for forming a device, comprises a first cluster that comprises a first processing chamber that comprises a target that comprises aluminum, a nitrogen containing gas source, a process gas source that is adapted to deliver a gas selected from a group consisting of argon, krypton or neon, a first power source configured to provide a pulsed DC signal or an RF signal at a power between about 500 Watts and about 20 kWatts to the target, an electrode coupled to a substrate support that has a substrate supporting surface, and a second power source that is configured to create a floating potential of between about −1000 volts and about +500 volts on one or more substrates that are disposed over the substrate supporting surface. In one configuration, a second cluster that comprises a second processing chamber that comprises a showerhead that is in fluid communication with a processing region, a group III metal containing precursor gas source that is coupled to a first plenum formed in the showerhead, and an ammonia containing gas source that is coupled to a second plenum formed in the showerhead may also be used.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numbers have been used, where possible, to designate identical elements that are common to the figures. It is contemplated that elements and features of one embodiment may be beneficially incorporated in other embodiments without further recitation.

DETAILED DESCRIPTION

Figure 1:
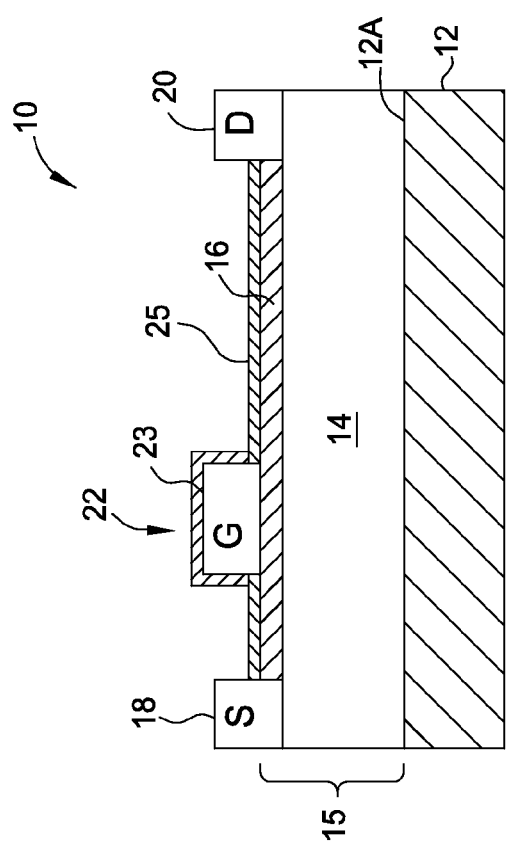
FIG. 1 is a schematic illustration of a structure of a conventional power device.

Embodiments of the invention described herein generally relate to apparatus and methods for forming high quality buffer layers and Group III-V layers that are used to form a useful semiconductor device, such as a power device, light emitting diode (LED), laser diode (LD) or other useful device. Embodiments of the invention may also include apparatus and methods for forming high quality buffer layers, Group III-V layers and electrode layers that are used to form a useful semiconductor device. In some embodiments, the apparatus and methods include the use of one or more cluster tools having one or more physical vapor deposition (PVD) chambers that are adapted to deposit a high quality aluminum nitride (AlN) buffer layer that has a high crystalline orientation on a surface of a plurality of substrates at the same time. In one embodiment, process conditions are provided for forming an AlN buffer layer suitable for use in a gallium nitride (GaN) containing device fabrication process. In one such embodiment, one or more AlN buffer layers are formed to have an atomically smooth surface with a roughness less than approximately 1 nanometer (rms) and desirable crystalline orientation in the (002) direction.

The fabrication of an aluminum nitride and a group III-nitride, such as gallium nitride, containing power devices, light emitting diodes (LEDs) using physical vapor deposition (PVD) and chemical vapor deposition processes are discussed further below. In the following description, numerous specific details are set forth, such as process chamber configurations and material regimes, in order to provide a thorough understanding of embodiments of the present invention. It will be apparent to one skilled in the art that embodiments of the present invention may be practiced without these specific details. In other instances, well-known features, such as specific device configurations, are not described in detail in order to not unnecessarily obscure embodiments of the present invention. Furthermore, it is to be understood that the various embodiments shown in the Figures are illustrative representations and are not necessarily drawn to scale. Additionally, other arrangements and configurations may not be explicitly disclosed in embodiments herein, but are still considered to be within the spirit and scope of the invention.

Methods of fabricating a conventional gallium nitride material containing device generally includes the formation of a buffer layer of gallium nitride between a substrate and a device layer that contains an un-doped and/or doped gallium nitride layer. In embodiments of the invention described herein, an aluminum nitride buffer layer is used in place of such a conventional gallium nitride buffer layer. The aluminum nitride (AlN) layer is generally formed using PVD or other sputtering, processes. Sputtering or PVD is in contrast to the fabrication of group III-nitride buffer layers which is typically performed in a metal-organic vapor deposition (MOCVD) chamber or a hydride vapor phase epitaxy (HVPE) chamber. In some cases, the aluminum nitride layer may be formed by either a non-reactive or a reactive PVD process. In one example, an aluminum nitride containing target housed in the PVD chamber is sputtered to form an aluminum nitride material on a surface of one or more substrates. Alternatively, and discussed further below, the aluminum nitride layer may be formed by a reactive sputtering process that uses an aluminum target and a nitrogen containing process gas to sputter and reactively form an aluminum nitride layer on a surface of one or more substrates.

Figure 2:
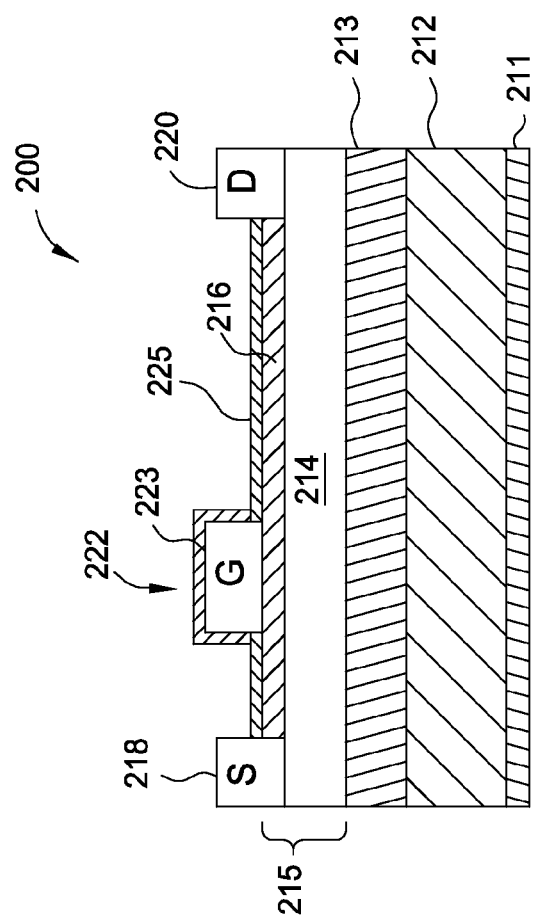
FIG. 2 is schematic illustration of a structure of a power device according to embodiments of the invention described herein.

FIG. 2 illustrates an example of a power semiconductor device 210 that includes a group III-nitride based heterojunction 215 disposed over a substrate 212, according to an embodiment of the invention. Heterojunction 215 includes a first group III-nitride semiconductor layer 214, a second group III-nitride semiconductor layer 216, and a PVD deposited buffer layer 213 disposed between the first group III-nitride semiconductor layer 214 and the substrate 212. Generally, the thickness of the PVD deposited buffer layer 213 may be between about 1 and about 1000 nanometer (nm). In one example, the PVD deposited buffer layer 213 has a thickness less than about 500 nm. A first power electrode 218 (i.e., source electrode) and a second power electrode 220 (i.e., drain electrode) are electrically connected to the first and second group III-nitride semiconductor layers through a direct ohmic connection or any other suitable electrical connection. In one embodiment, the first power electrode 218 and a second power electrode 220 comprise a layer that comprises a metal selected from a group consisting of silver (Ag), gold (Au), palladium (Pd), aluminum (Al), tungsten (W), platinum (Pt), indium (In), zinc (Zn) and titanium (Ti), combinations thereof, or other useful conductive metals. A gate structure 222 is disposed between first power electrode 218 and second power electrode 220 over second group III-nitride semiconductor body 214. Gate structure 222 may include gate electrode 223, which is connected to a second group III-nitride semiconductor layer 216. Alternatively, gate structure 222 may include a Schottky type gate electrode connected to a second group III-nitride semiconductor body 216. In at least one configuration, the first group III-nitride semiconductor layer 214 is a gallium nitride (GaN) containing layer, the second group III-nitride semiconductor layer 216 is an aluminum gallium nitride (AlGaN), which are disposed over the PVD deposited buffer layer 213 and a substrate 212 that is formed from a desirable material, such as monocrystalline silicon. In one example, the substrate 212 comprises a <111> oriented or a <110> oriented crystalline silicon substrate. In at least one configuration, the insulation layer 225 may contain silicon nitride (SiN) and the first power electrode 218, the second power electrode 220 and the gate electrode 223 all include a metal. Exemplary substrates 201 include sapphire, silicon carbide (SiC), silicon (Si), diamond, lithium aluminate ($LiAlO_2$), zinc oxide ($ZnO_x$), tungsten (W), copper (Cu), gallium nitride (GaN), aluminum gallium nitride (AlGaN), aluminum nitride (AlN), soda lime glass and/or high silica glass. In general, the substrates can be formed from a material that has a compatible lattice constant and a thermal expansion coefficient, a substrate that is compatible with the group III-V material grown thereon, or a substrate that is thermally and chemically stable at the group III-V growth temperatures.

In some configurations of the power semiconductor device 210, the PVD deposited buffer layer 213 is an active layer in the power device that is able to improve the breakdown voltage (e.g., ~900 $V_{DC}$) of the device and allow a thinner first group III-nitride semiconductor layer 214 to be used. Therefore, the formed power semiconductor device 210 will have improved device properties and the process of forming the device will have a higher throughput (e.g., layer 214 is thinner than conventional devices) and have a lower manufacturing cost (e.g., consume less precursor gases to form the thinner layers).

A PVD deposited aluminum nitride (AlN) buffer layer 213 may be used within a gallium nitride (GaN) based LED and power device that is grown on a substrate 201, such as silicon (Si). Embodiments of the invention discussed herein are used to form a high quality PVD AlN buffer layer that has a high crystalline orientation so that it can be used to improve the material quality of the GaN layers grown on top of the buffer layer 213 and, thus, improve the formed device's performance and reliability. A PVD AlN buffer layer and related formation process may be used to eliminate operations typically required for MOCVD growth of a GaN buffer layer, such as, but not limited to substrate pre-baking, low temperature MOCVD buffer formation, and certain required temperature ramping operations. Additionally, the buffer layer formation time, using one or more of the PVD deposition processes described herein, may be reduced by approximately 10-30% over conventional MOCVD processes. The formed AlN buffer layer can also be used to protect the surface of a silicon containing substrate from gallium induced damage due to the interaction of the gallium precursor used in the MOCVD process and the surface of the silicon substrate. A PVD AlN layer deposition process is believed to save about 3 to 6 hours of processing cycle time over a MOCVD process otherwise based on epitaxial growth, especially when one accounts for the frequent MOCVD chamber cleaning process steps. Such process time reduction may greatly enhance the substrate throughput in a cluster tool system. It is to be understood that the crystal quality of PVD AlN may directly impact the material quality of a GaN layer grown thereon. Accordingly, in an embodiment described herein, a PVD AlN layer is provided that has a high crystal quality and enhanced process repeatability.

Figure 3:
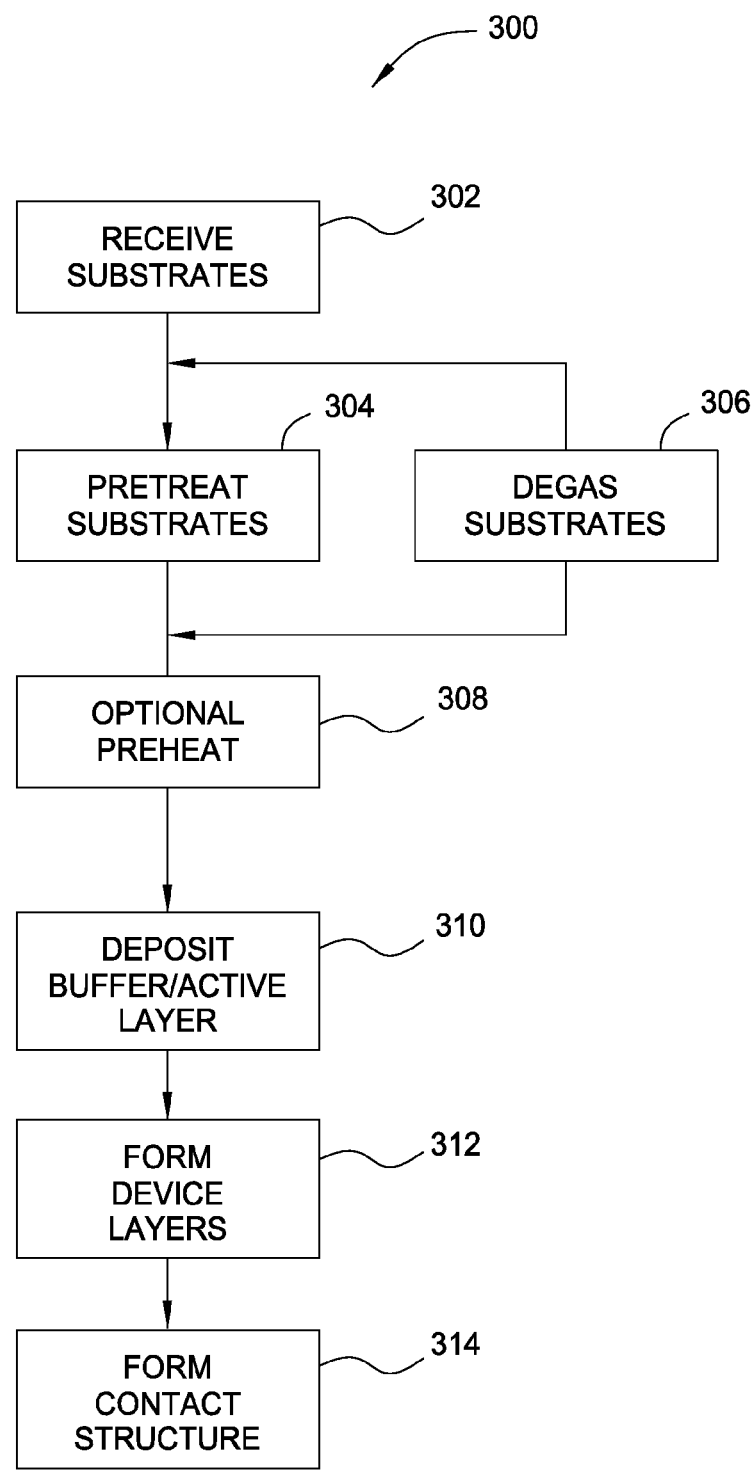
FIG. 3 illustrates a processing sequence in accordance with one embodiment of the present invention

FIG. 3 illustrates a processing sequence 300 that is used to form at least portions of a useful semiconductor device, such as a power device, as will be discussed further below. In one embodiment, the processing sequence 300 includes one or more substrate preprocessing steps, such as steps 302-308, a buffer layer formation step 310, one or more device layer formation steps (e.g., step 312) and one or more contact layer formation steps (e.g., step 314). The processing steps 302-314 can be performed in one or more processing chambers that are preferably disposed on one or more cluster tools. Exemplary processing steps 302-314 and cluster tools 401, 601 and 701 are further discussed below. In one embodiment, each cluster tool 401, 601 and 701 has a plurality of processing chambers that are each adapted to process a plurality of substrates at the same time, commonly referred to as batch processing. In this configuration, the plurality of substrates may be disposed on a carrier 451 (FIG. 4), which is adapted to support and retain the substrates 201 as they are transferred and processed through the processing system.

Figure 4:
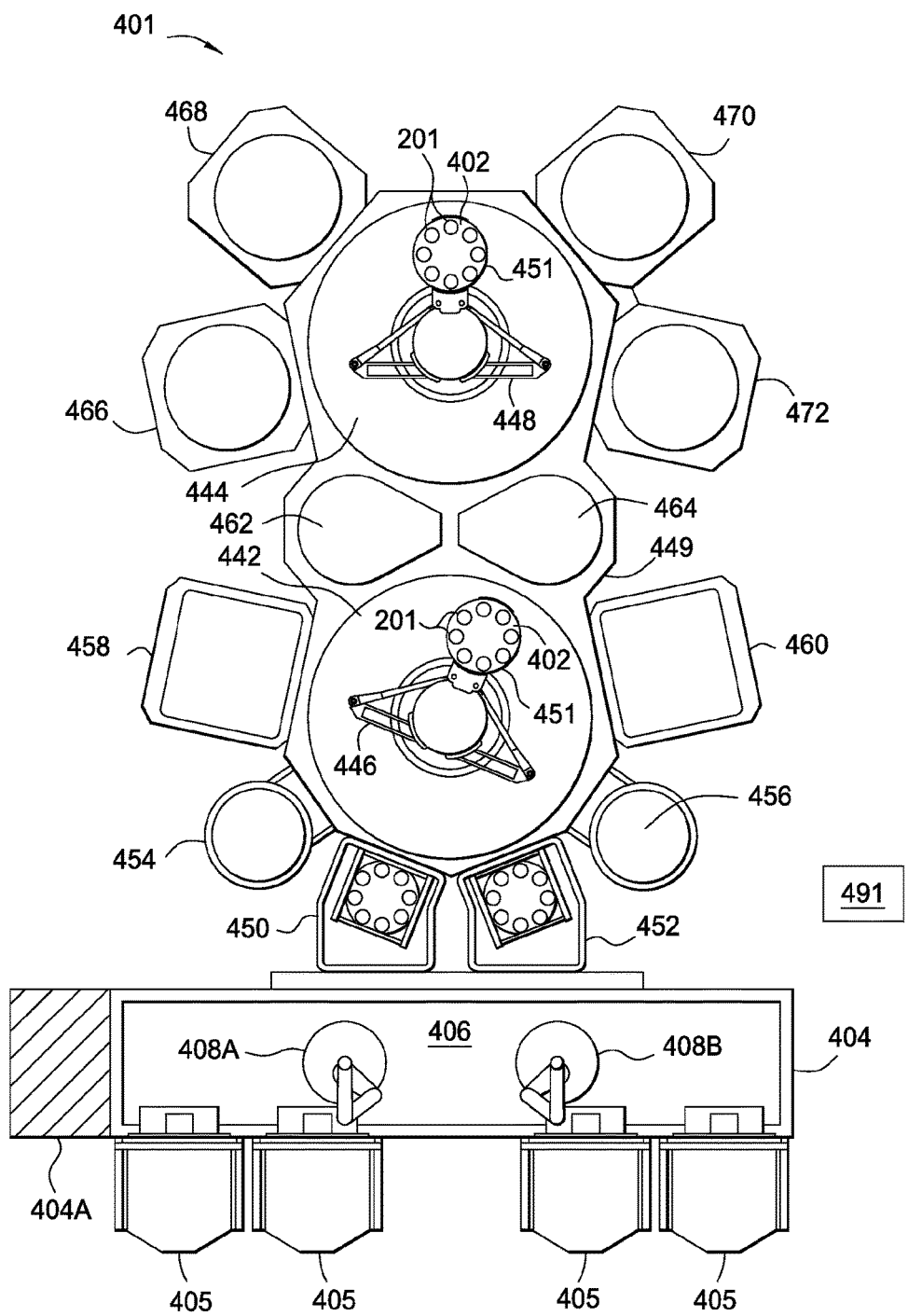
FIG. 4 illustrates a cluster tool according to embodiments of the invention described herein.
Figure 5:
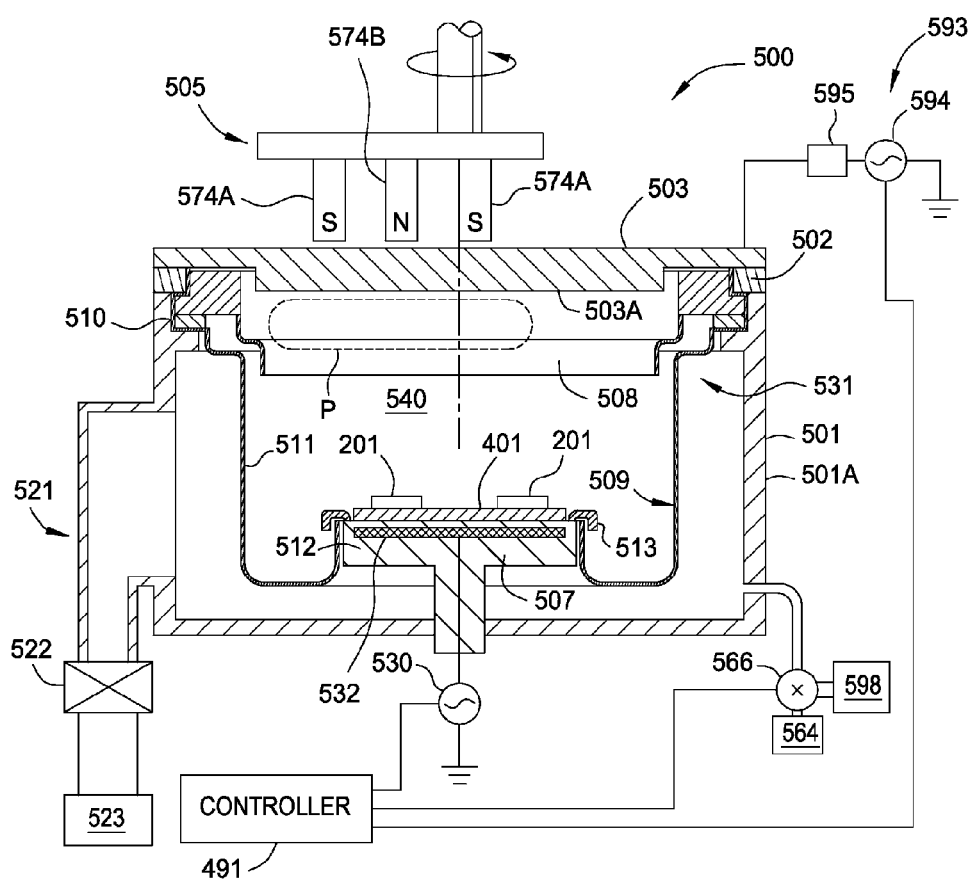
FIG. 5 illustrates a processing chamber according to embodiments of the invention described herein
Figure 6:
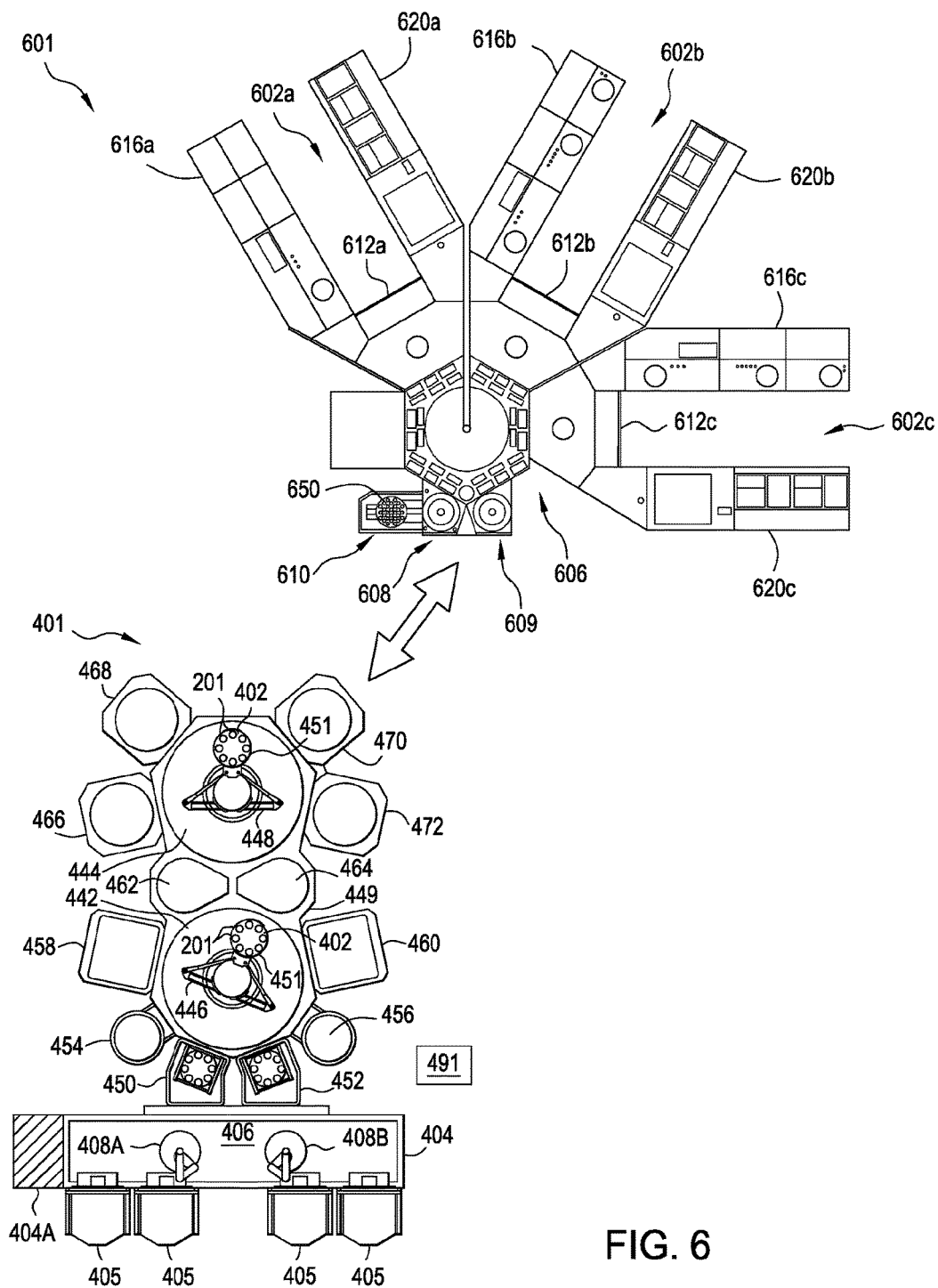
FIG. 6 illustrates a processing system that can be used to complete the processing sequence illustrated in FIG. 3 according to embodiments of the invention.
Figure 7:
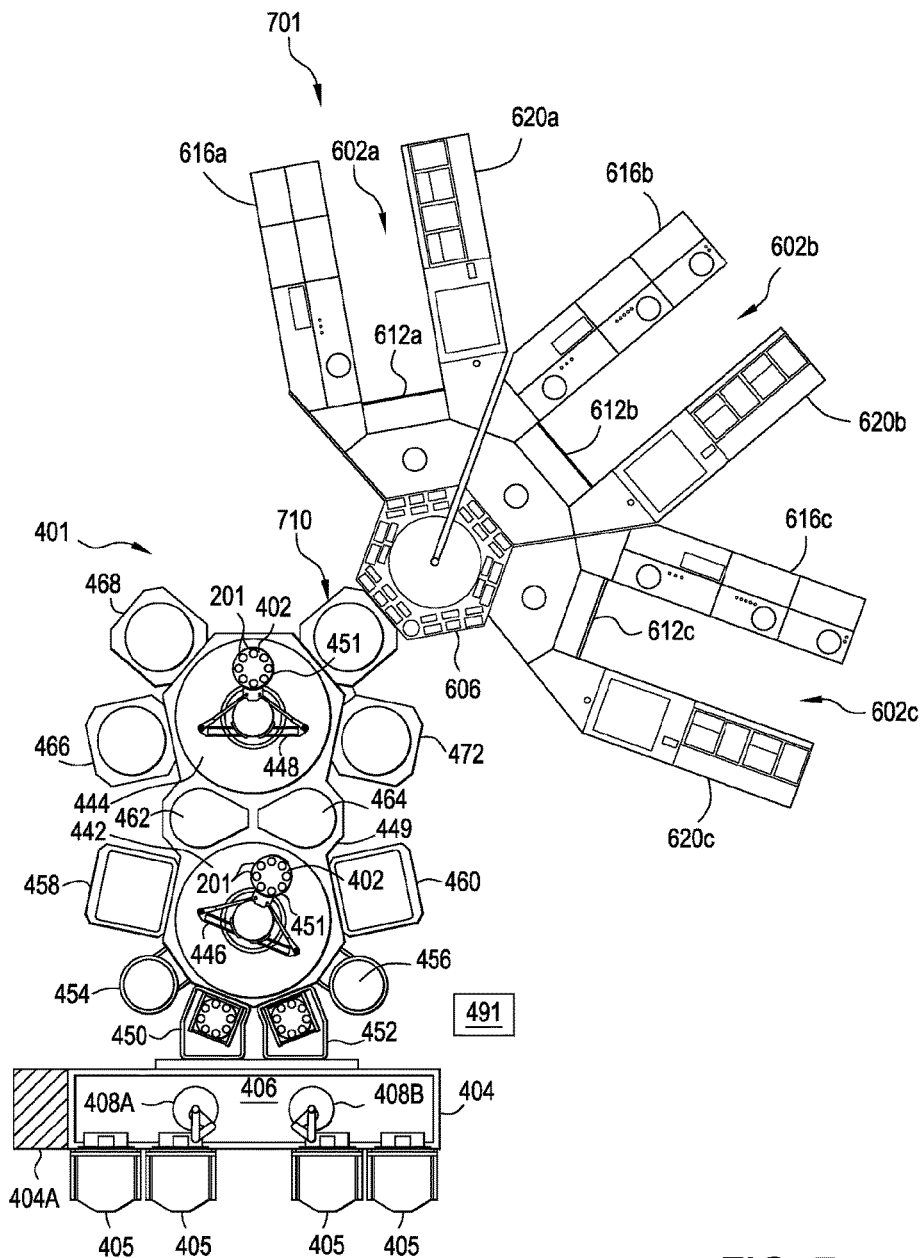
FIG. 7 illustrates another processing system that can be used to complete the processing sequence illustrated in FIG. 3 according to embodiments of the invention.
Figure 8:
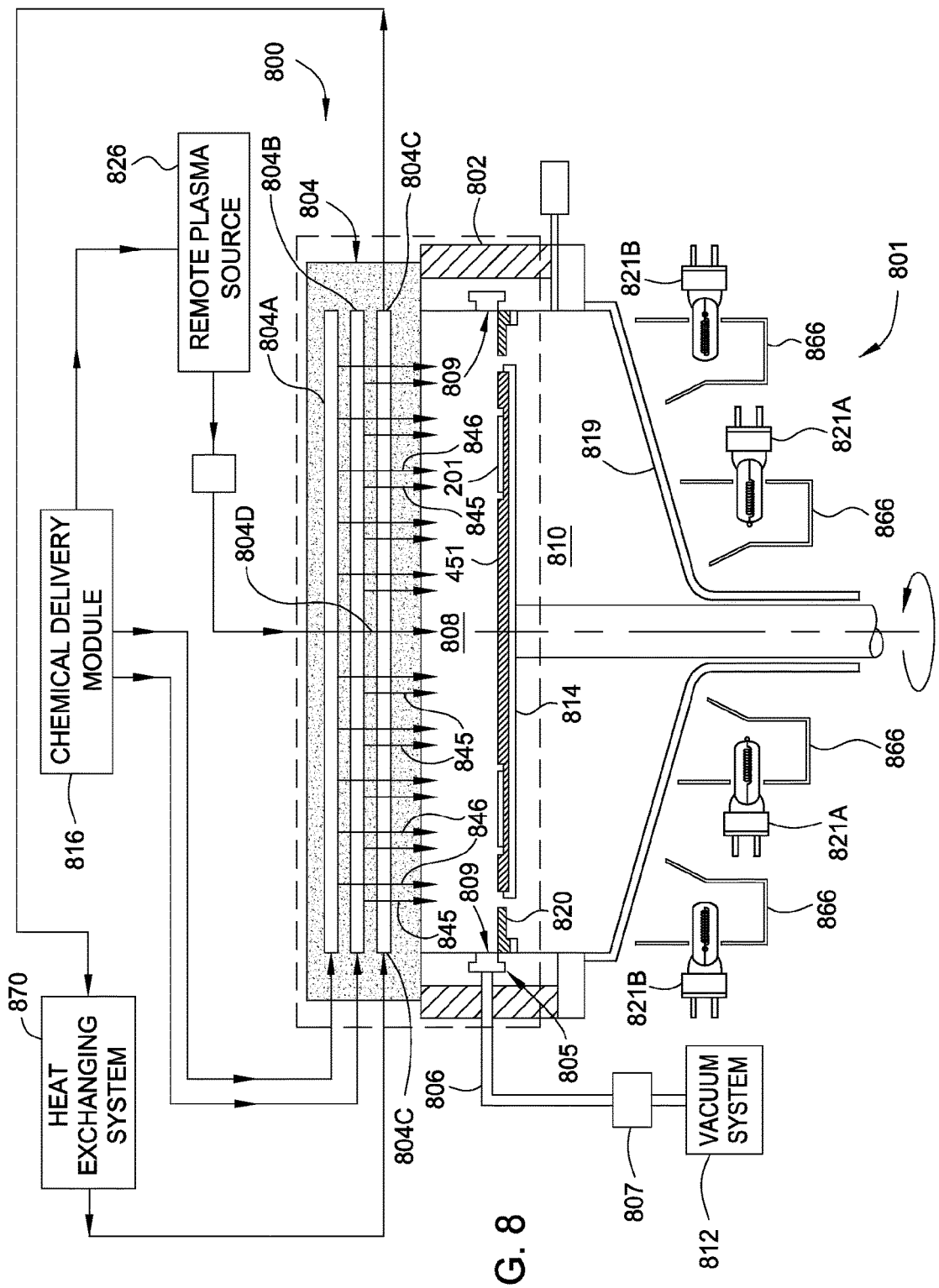
FIG. 8 illustrates a processing chamber that is adapted to perform one or more of the processing steps illustrated in FIG. 3.

FIG. 4 illustrates a cluster tool 401 that is adapted to perform one or more of the processing steps 302-314 shown in FIG. 3. The cluster tool 401 is generally commercially available from Applied Materials, Inc. of Santa Clara, Calif., and is known as the Endura® system. FIG. 5 illustrates one configuration of a processing chamber that can be used in a cluster tool, such as the processing chambers 466-472 shown in FIG. 4. FIG. 6 illustrates a processing system 600 that can be used to complete the processing sequence illustrated in FIG. 3. The processing system 600 may comprise the cluster tool 401 and a cluster tool 601. FIG. 7 illustrates an example of a processing system 700 that can alternately be used to complete the processing sequence illustrated in FIG. 3. FIG. 8 illustrates an MOCVD chamber 801 that is adapted to perform one or more of the processing steps 302-314 shown in FIG. 3.

In one embodiment, the cluster tool 401 includes first and second transfer chambers 442, 444, containing therein respective first and second robots 446, 448 for moving one or more substrates between various processing chambers 454-472 arranged within and about the transfer chamber peripheries. The various processing chambers 454-464 that are arranged around the periphery of the first transfer chamber 442 and the processing chambers 466-472 that are arranged around the periphery of the second transfer chamber 444 can be selectively isolated from each other by use of slit valves (not shown) that are disposed between each of the processing chambers and their respective transfer chamber 442, 444. In some configurations, the first transfer chamber 442 is vacuum pumped to a moderately low pressure, for example, about 1 milliTorr, while the second transfer chamber 444 is pumped to a much lower pressure, for example, 1 microTorr.

In one embodiment, the cluster tool 401 generally comprises a factory interface 404, one or more load locks 450, 452, a first robot 446, one or more optional orient chambers 454, 456, one or more degas chambers 458, 460, one or more processing chambers 462, 464, a second robot 448 and a plurality of processing chambers 466-472 that are all directly or indirectly coupled to a mainframe 449. In one configuration the first and second robots 446 and 448 are "frog-leg" type robots that are available from Applied Materials, Inc. of Santa Clara, Calif. The degas chambers 458, 460 generally comprise a heat source, such as lamps or resistive heater, that is adapted to heat the carrier 451 and substrates 201 to a desired temperature under a vacuum condition to assure that any undesirable water or other contamination is removed from the surface of the substrates 201 prior to processing in one of the processing chambers 462-472. The one or more optional orient chambers 454, 456 are generally used to align the carrier 451, and/or substrates 201, in a desired rotational orientation within the system.

As noted above, in one embodiment, the cluster tool 401 is configured to transfer and process a plurality of substrates 201 in a batch processing type of configuration. In this configuration, the first and second robots 446, 448 and processing chambers 454-472 are able to receive and process substrates 201 that are disposed on the carrier 451. In one example, as illustrated in FIG. 4, the carrier 451 is configured to support and retain eight substrates 201 on a surface 402 of the carrier 451. In another example, the carrier 451 is configured to support and retain about 30 two inch substrates 201. In one example, the carrier 451 may range from 200 mm-750 mm in diameter. The carrier 451 may be formed from a variety of materials, including SiC or SiC-coated graphite. In one embodiment, the carrier 451 comprises a silicon carbide material and has a surface area of about 1,000 $cm^2$ or more, preferably 2,000 $cm^2$ or more, and more preferably 4,000 $cm^2$ or more. Exemplary embodiments of the carrier 451 are further described in U.S. patent application Ser. No. 12/871,143, filed Aug. 28, 2009, entitled "Wafer Carrier Design for Improved Photoluminescence Uniformity".

The robots 446, 448 move substrates, and/or carriers 451 containing multiple substrates 201, between the two transfer chambers 442, 444 through double-gated processing chambers 462, 464, which also provide the vacuum isolation between the two transfer chambers 442, 444. In some configurations, one or more of the processing chambers 462, 464 are further adapted to perform a pre-clean process (e.g., non-selective sputter etching process), temperature regulation (e.g., cool down), or other desirable operation.

The second robot 448 is configured to transfer substrates, and/or carriers 451 containing multiple substrates 201, to and from the processing chambers 462-472 that are attached to the transfer chamber 444. The processing chambers 466-472 are configured to process the substrates therein, such as etch or deposit one or more layers on a surface of the substrates 201. In one configuration, the processing chambers 466-472 are configured to deposit the buffer layer 213 on the surface of the substrates 201 by use of a PVD, or sputtering, process. PVD type deposition, and other similar deposition techniques, require high vacuum, so as to not oxidize and/or contaminate the deposited films, and thus the transfer chamber 444 is maintained at least at a moderate vacuum level to prevent the contamination between layers. All the processing chambers associated with the second transfer chamber 444 are separated from it by respective slit valves.

In one embodiment of the cluster tool 401, a plurality of carriers 451, having a plurality of substrates 201 disposed thereon, are loaded into a cassette 405 that is coupled to a factory interface 404, which is coupled to the first transfer chamber 442 through the load lock chambers 450, 452. The load lock chambers 450, 452 are each selectively isolated from both the first transfer chamber 442 by slit valves (not shown) and from the exterior region 406 of the factory interface 404 by vacuum doors (not shown). In this configuration, the factory interface robots 408A, 408B in the factory interface are configured to move a carrier 451 from a cassette 405 to a load lock 450, 452, where it is then isolated from the exterior region 406 of the factory interface 404 by the vacuum door (not shown) coupled to the load lock. After the load lock 450, 452 is pumped down to a desired pressure, the carrier 451, which is disposed in the load lock, can then be accessed by the first robot 446 through a slit valve opening (not shown) formed between the transfer chamber 442 and the load lock 450, 452.

In another embodiment, each of the cassettes 405 are configured to receive one or more stacked wafer cassettes (not shown), which each contain a plurality of substrates 201. In this configuration, the substrates 201 are removed from a stacked wafer cassette, which is disposed in a cassette 405, by one of the factory interface robots 408A, 408B and then transferred to a carrier loading module 404A that is coupled to the factory interface 404. The carrier loading module 404A is then adapted to receive each of the transferred substrates and position them on a carrier 451. Once the carrier 451 has a desired number of substrates loaded thereon, one of the factory interface robots 408A, 408B will transfer the carrier 451 and substrates 201 from the carrier loading module 404A and load them into a load lock chamber 450, 452 for processing. After the substrates 201 are processed in the cluster tool 401 the carrier 451 can be unloaded by the components found in the carrier loading module 404A and the processed substrates 201 can be returned to their respective stacked wafer cassette. An example of a carrier loading module 404A that may be adapted to perform one or more of the above steps is further described in the co-pending and commonly assigned U.S. patent publication number 2010/0111650, which is incorporated by reference herein.

A processing chamber 500, or reactor, that is adapted to deposit a suitable sputtered film on a surface of the substrates 201 is illustrated in FIG. 5. One or more of the processing chambers 466-472 may contain the components found in the processing chamber 500, which is a magnetron type PVD chamber available from Applied Materials, Inc. of Santa Clara, Calif.

The processing chamber 500 includes a vacuum chamber 501, a target 503, a magnetron 505, vacuum pumping system 521, a substrate support assembly 513, and a process kit 531. The vacuum chamber 501 supports the target 503, which is sealed at one end of the vacuum chamber 501 through a target isolator 502 using a plurality of o-rings. The target 503 has at least a surface portion composed of material to be sputter deposited on substrates 201 disposed on the carrier 451. The magnetron 505, which is disposed adjacent to and rotated relative to the target 503, includes a plurality of magnets 574A-574B that are used to confine a plasma generated in the processing region 540 by biasing the target 503 using a power source 593 to "sputter" material from the target surface 503A. It is appreciated that the type of magnetron may vary, depending upon the particular application. The power source 593 generally comprises a power supply 594 that is configured to deliver DC and/or RF power to the target 503. In some RF power delivery configurations, the power source 593 may also include a match 595.

The vacuum pumping system 521 generally comprises a pump assembly 523 and valve 522. The pump assembly 523 will generally comprise a cryopump (not shown) and roughing pump(s) (not shown) that are used to maintain a desirable pressure in the processing region 540 of the processing chamber 500.

In one embodiment, the substrate support assembly 513 comprises a pedestal electrode 507, which may comprise an electrostatic chuck 512 that has a supporting surface that is adapted to support a carrier 451 and substrates 201 over the pedestal electrode 532. It is appreciated that other devices may be used to hold the carrier 451 and substrates 201 in place during processing. Resistive heaters (not shown), refrigerant channels (not shown), and a thermal transfer gas cavities (not shown) may be formed in the pedestal 507 to provide thermal control of the substrates during processing. In some applications, the pedestal electrode 532, which is coupled to a power source 530, may apply an RF and/or a DC bias to the substrates 201 to attract plasma ionized deposition material and processes gases. In other applications, biasing of the substrates may be reduced or eliminated to further reduce the potential for damage to the deposited layer.

In one embodiments of the invention, a pulsed DC, RF and/or pulsed RF bias signal is applied to the target 503 by the power source 593, which has been found to significantly improve the deposition of a desirable barrier layer, such as an aluminum nitride layer barrier layer, as will be discussed further below. To attract the ions generated by the plasma to sputter the target 503, the target 503 is in one embodiment biased by the power source 593 to provide an average power of 1 to 20 kW, for example. The pulsed DC and/or RF bias signals applied to the target 503 may include a signal that has a plurality of alternating first and second intervals, wherein in each of the first intervals, the voltage of the applied bias signal is negative to attract ions to sputter the target, and during the alternating second intervals, the applied bias signal is lower than the bias applied during the first interval, unbiased (e.g., zero applied voltage) or even have a positive voltage to repel positively charged ions from the target 503 to reduce arcing. One skilled in the art will appreciate that the pulsed bias signal applied to a target 503 can provide many beneficial processing advantages, depending upon the particular application. For example, it is believed that the pulsed bias signal can be used to reduce the deposition rate, form a more stable plasma, and increase the peak energy in the plasma for effectively controlling the plasma chemistry to form a desirable multi-component film layer. For example, films which are closer to true stoichiometric proportions might be obtained when a pulsed biasing signal is applied to a target 503. Still other possible features include an increase in film quality, particularly for multi-component films. It is also believed that film sheet resistance may be reduced, due to possible elimination of undesirable micro voids and columnar structures, when a pulsed bias is applied. It is appreciated, however, in some applications, a non-pulsed biasing signal, which is a constant DC or an RF power level bias signal, may be applied to bias the target 503 during one or more parts of the deposition process, or even in combination with a pulsed bias signal, depending upon the particular application.

The process kit 531 generally contains a cover ring 513, darkspace shield 508 and a chamber shield 509 that are separated by a second dielectric shield isolator 510. The process kit 531 parts are positioned within the vacuum chamber 501 to protect the chamber wall 501A, which usually comprises a metal that is electrically grounded, from the sputtered material generated in the processing region 540. In one embodiment, the darkspace shield 508 is permitted to float electrically and the chamber shield 509 is electrically grounded. However, in some embodiments, either or both shields may be grounded, floating or biased to the same or different nonground levels. The shields 508, 509 are typically composed of stainless steel, and their inner sides (e.g., item number 511) may be bead-blasted or otherwise roughened to promote adhesion of the material sputter deposited on them. At some point during prolonged sputtering, however, the deposited material builds up to a thickness that is likely to flake off, producing deleterious particles. Before this point is reached, the shields 508, 509 should be cleaned or replaced.

In some applications, the substrate may be biased to attract or repel ions generated in the formed plasma as appropriate for that application. For example, a source 530 may be provided to apply RF power to the pedestal electrode 507 to bias the substrates 201 to attract deposition material ions during the deposition process. In addition, the source 530 may be configured to apply RF power to the pedestal electrode 507 to couple supplemental energy to the plasma. During the deposition process, the pedestal 507 and hence the substrates 201 may be left electrically floating, but a negative DC self-bias may nonetheless develop on it. Alternatively, the pedestal 507 may be negatively biased by a source at a negative voltage of between −1000 Volts to +500 Volts, such as about −30 VDC for example, to negatively bias the substrates 201 to attract the ionized deposition material to the substrate. In some configurations, a capacitor tuner, as discussed further below, is used with a power source is used to control the floating potential on the substrates 201 during processing. In yet another alternative, the substrates 201 may be left floating electrically.

If the source 530, used to bias the substrates 201 through the pedestal, is an RF power supply, the supply may operate at a frequency of 13.56 MHz, for example. Other frequencies are suitable such as 60 MHz, depending upon the particular application. The pedestal 507 may be supplied with RF power in a range of 10 watts to 5 kW. The above-mentioned power and voltage levels and frequencies may vary of course, depending upon the particular application. A computer-based controller 491 may be programmed to control the power levels, voltages, currents and frequencies of the various sources in accordance with the particular application.

Referring again to FIG. 5, a gas source 564 supplies a sputtering working gas, such as, for example, the chemically inactive noble gas, such as argon, to the chamber 501 through a mass flow controller 566. The working gas can be admitted to the top of the chamber or, as illustrated, at its bottom, either with one or more inlet pipes penetrating apertures through the bottom of the shield chamber shield 509 or through a gap between the chamber shield 509, the electrostatic chuck 512, and the pedestal 507. During reactive PVD processes a nitrogen gas may be delivered from a source 598 to form a nitride containing layer, such as aluminum nitride, on the substrates 201.

FIG. 6 is a schematic top view of the cluster tool 401 and cluster tool 601 of the processing system 600, which is used to fabricate compound nitride semiconductor devices according to at least one embodiment of the invention. It is contemplated that the processes described below with respect to FIG. 3 may be also preformed in other suitable processing system configurations. Similar to the cluster tool 401, which is discussed above, the environment within the cluster tool 601 may be maintained in a vacuum state, or at a pressure below atmospheric pressure to prevent oxidation and/or contamination of the substrates processed therein. In certain embodiments, it may be desirable to backfill the cluster tool 601 with an inert gas such as nitrogen.

A system controller 491 controls activities and operating parameters of the automated components found in the processing system 600. In general, the bulk of the movement of the a substrate through the cluster tool(s) found in the processing system is performed by use of one or more automation devices that are adapted to move and position the one or more substrates 201 so that they can be received by, or positioned within, the cluster tool(s) by use of commands sent by a system controller 491. In some embodiments, a plurality of substrates 201 are transferred on a carrier 451 between the cluster tools 401 and 601 using an automated transferring device (not shown), such as a substrate conveyor. In other embodiments, each carrier 451 is associated with a particular cluster tool 401, 601 and the substrates are transferred between the cluster tools 401 and 601 using an automated device that is adapted to transfer one or more wafer cassettes that each hold one or more substrates. The system controller 491 is a general use computer that is used to control one or more components found in the cluster tool(s) 401, 601, 701. The system controller 491 is generally designed to facilitate the control and automation of the processing sequence 300 and typically includes a central processing unit (CPU) (not shown), memory (not shown), and support circuits (or I/O) (not shown). Software instructions and data can be coded and stored within the memory for instructing the CPU. A program (or computer instructions) readable by the system controller determines which tasks are performable on a substrate. Preferably, the program is software readable by the system controller that includes code to perform tasks relating to monitoring, execution and control of the movement, support, and/or positioning of a substrate along with the various process recipe tasks and various processing module process recipe steps being performed. The processor executes system control software, such as a computer program stored in memory. Aspects of the processing system and methods of use are further described in U.S. patent application Ser. No. 11/404,516, filed Apr. 14, 2006, now published as US 2007/024516, entitled "EPITAXIAL GROWTH OF COMPOUND NITRIDE STRUCTURES," which is hereby incorporated by reference in its entirety.

The cluster tool 601 generally includes a transfer chamber 606, a first process chamber 602a, a second process chamber 602b, and a third process chamber 602c coupled with the transfer chamber 606, a load lock chamber 608 coupled with the transfer chamber 606, a batch load lock chamber 609 for storing substrates, and a load station 610 for loading substrates. The transfer chamber 606 comprises a robot assembly (not shown) operable to pick up and transfer substrates between the load lock chamber 608, the batch load lock chamber 609, and the process chambers 602a-c. Although three process chambers 602a, 602b, 602c are shown, it should be understood that any number of process chambers may be coupled with the transfer chamber 606. The process chambers 602a, 602b, 602c may be metal oxide chemical vapor deposition (MOCVD) chambers (such as the MOCVD chamber 801 shown in FIG. 8, described below) or Hydride Vapor Phase Epitaxial (HVPE) chambers that are coupled to the transfer chamber 606. Alternatively, the processing system 600 may be an in-line system without a transfer chamber. In various embodiments, a PVD, CVD, or ALD chamber may be additionally included or replaced with one of the MOCVD or HVPE chambers coupled to the transfer chamber 606 upon application. Exemplary MOCVD, HVPE, PVD, CVD, or ALD chambers can be purchased from Applied Materials, Inc. of Santa Clara, Calif.

Each process chamber 602a, 602b, 602c generally includes a chamber body 612a, 612b, 612c that define a processing region where one or more substrates are placed to undergo processing, a chemical delivery module 616a, 616b, 616c from which gas precursors are delivered to the chamber body 612a, 612b, 612c, and an electrical module 620a, 620b, 620c for each process chamber 602a, 602b, 602c that includes the electrical system for each process chamber of the cluster tool 601. In some embodiments, each process chamber 602a, 602b, 602c is adapted to perform CVD processes in which, for example, metalorganic elements react with metal hydride elements to form thin layers of compound nitride semiconductor materials.

The transfer chamber 606 may remain under vacuum or at a pressure below atmospheric pressure during processing. The vacuum level of the transfer chamber 606 may be adjusted to match the vacuum level of the process chamber 602a. For example, when transferring a substrate from the transfer chamber 606 into the process chamber 602a (or vice versa), the transfer chamber 606 and the process chamber 602a may be maintained at the same vacuum level. Then, when transferring a substrate from the transfer chamber 606 to the load lock chamber 608 or batch load lock chamber 609 (or vice versa), the transfer chamber vacuum level may match the vacuum level of the load lock chamber 608 or batch load lock chamber 609 even through the vacuum level of the load lock chamber 608 or batch load lock chamber 609 and the process chamber 602a may be different. In certain embodiments it may be desirable to backfill the transfer chamber 606 with an inert gas such as nitrogen. For example, the substrate may be transferred in an environment having greater than 90% $N_2$ or $NH_3$. Alternatively, the substrate may be transferred in a high purity $H_2$ environment, such as in an environment having greater than 90% $H_2$.

In the cluster tool 601, the robot assembly transfers a carrier 451 loaded with one or more substrates 201 into the first process chamber 602a to undergo a first deposition process. The robot assembly transfers the carrier 451 into the second process chamber 602b to undergo a second deposition process. The robot assembly transfers the carrier 451 into either the first process chamber 602a or the third process chamber 602c to undergo a third deposition process. After all or some of the deposition steps have been completed, the carrier 451 is transferred from the process chamber 602a-602c back to the load lock chamber 608. The carrier 451 is then transferred to the load station 610. Alternatively, the carrier 451 may be stored in either the load lock chamber 608 or the batch load lock chamber 609 prior to further processing in one or more of the process chambers 602a-602c. One exemplary system is described in U.S. patent application Ser. No. 12/023,572, filed Jan. 31, 2008, entitled "PROCESSING SYSTEM FOR FABRICATING COMPOUND NITRIDE SEMICONDUCTOR DEVICES," which is hereby incorporated by reference in its entirety.

As discussed above, FIG. 7 illustrates an example of a processing system 700 that can alternately be used to complete at least part of the processing sequence illustrated in FIG. 3. In this configuration, the cluster tool 401 and cluster tool 601 are coupled together through a transfer chamber 710 that can be separately isolated from the transfer chambers 444 and 606 by use of a slit valve (not shown) disposed on either side of the transfer chamber 710. One or more of the robots in either cluster tool are configured to transfer the substrates 201 to a position within the transfer chamber 710 so that the carrier 451 and substrates 201 can be handed off between the cluster tools. Therefore, the substrates 201 that are processed in either cluster tool 401 or cluster tool 601 need not be exposed to the atmospheric environment (outside of cluster tools 401, 601) when they are transferred between the cluster tools.

FIG. 8 is a schematic cross-sectional view of an MOCVD chamber 801 that may be used for fabricating compound nitride semiconductor devices according to at least one embodiment of the invention. The MOCVD chamber 801 may be one or more of the processing chambers 602a, 602b or 602c, as described above with reference to systems 600 and 700. The MOCVD chamber 801 generally includes a chamber body 802, a chemical delivery module 816 for delivering precursor gases, carrier gases, cleaning gases, and/or purge gases, a remote plasma system 826 with a plasma source, a susceptor or substrate support 814, and a vacuum system 812. The chamber body 802 of the MOCVD chamber 801 encloses a processing region 808. A showerhead assembly 804 is disposed at one end of the processing region 808, and a carrier 451 is disposed at the other end of the processing region 808. The carrier 451 may be disposed on the substrate support 814.

In one embodiment, the showerhead assembly 804 may be a dual-zone assembly having a first processing gas channel 804A coupled with the chemical delivery module 816 for delivering a first precursor or first process gas mixture to the processing region 808, a second processing gas channel 804B coupled with the chemical delivery module 816 for delivering a second precursor or second process gas mixture to the processing region 808 and a temperature control channel 804C coupled with a heat exchanging system 870 for flowing a heat exchanging fluid to the showerhead assembly 804 to help regulate the temperature of the showerhead assembly 804. Suitable heat exchanging fluids may include water, water-based ethylene glycol mixtures, a perfluoropolyether (e.g. Galden® fluid), oil-based thermal transfer fluids, or similar fluids.

During processing the first precursor or first process gas mixture may be delivered to the processing region 808 via gas conduits 846 coupled with the first processing gas channel 804A in the showerhead assembly 804 and the second precursor or second process gas mixture may be delivered to the processing region 808 via gas conduits 845 coupled with the second processing gas channel 804B in the showerhead assembly 804. The process gas mixtures or precursors may include one or more precursor gases or process gases, as well as carrier gases and/or dopant gases, which may be mixed with precursor gases. Exemplary showerheads that may be adapted to practice embodiments described herein are described in U.S. patent application Ser. No. 11/873,132, filed Oct. 16, 2007, entitled "MULTI-GAS STRAIGHT CHANNEL SHOWERHEAD," U.S. patent application Ser. No. 11/873,141, filed Oct. 16, 2007, now published as US 2009-0095222, entitled "MULTI-GAS SPIRAL CHANNEL SHOWERHEAD," and U.S. patent application Ser. No. 11/873,170, filed Oct. 16, 2007, now published as US 2009-0095221, entitled "MULTI-GAS CONCENTRIC INJECTION SHOWERHEAD," all of which are incorporated by reference in their entireties.

A lower dome 819 is disposed at one end of a lower volume 810, and the carrier 451 is disposed at the other end of the lower volume 810. The carrier 451 is shown in process position, but may be moved to a lower position where, for example, the substrates 201 may be loaded or unloaded. An exhaust ring 820 may be disposed around the periphery of the carrier 451 to help prevent deposition from occurring in the lower volume 810 and also help direct exhaust gases from the MOCVD chamber 801 to exhaust ports 809. The lower dome 819 may be made of transparent material, such as high-purity quartz, to allow light to pass through for radiant heating of the substrates 201. The radiant heating may be provided by a plurality of inner lamps 821A and outer lamps 821B disposed below the lower dome 819 and reflectors 866 may be used to help control the MOCVD chamber 801 exposure to the radiant energy provided by inner and outer lamps 821A and 821B. Additional rings of lamps may also be used for finer temperature control of the substrates 201.

A purge gas may be delivered into the MOCVD chamber 801 from the showerhead assembly 804 and/or from inlet ports or tubes (not shown) disposed below the carrier 451 and near the bottom of the chamber body. The purge gas enters the lower volume 810 of the MOCVD chamber 801 and flows upwards past the carrier 451 and exhaust ring 820 and into multiple exhaust ports 809 which are disposed around an annular exhaust channel 805. An exhaust conduit 806 connects the annular exhaust channel 805 to a vacuum system 812 which includes a vacuum pump 807. The MOCVD chamber 801 pressure may be controlled using a valve system, which controls the rate at which the exhaust gases are drawn from the annular exhaust channel. Other aspects of the MOCVD chamber are described in U.S. patent application Ser. No. 12/023,520, filed Jan. 31, 2008, entitled "CVD APPARATUS," which is herein incorporated by reference in its entirety.

If desired, a cleaning gas (e.g., a halogen containing gas, such as chlorine gas) may be delivered into the MOCVD chamber 801 from the showerhead assembly 804 and/or from inlet ports or tubes (not shown) disposed near the processing region 808. The cleaning gas enters the processing region 808 of the MOCVD chamber 801 to remove deposits from chamber components such as the substrate support 814 and the showerhead assembly 804 and exits the MOCVD chamber 801 via multiple exhaust ports 809 which are disposed around the annular exhaust channel 805.

The chemical delivery module 816 generally supplies precursors and/or chemicals to the MOCVD chamber 801. Reactive gases, carrier gases, purge gases, and cleaning gases are supplied from the chemical delivery module 816 through supply lines and into the chamber 801. The gases may be supplied through supply lines and into a gas mixing box, where they are mixed together and delivered to showerhead assembly 804. Depending upon the process scheme, some of the precursor and/or chemicals delivered to the MOCVD chamber 801 may be liquid rather than gas. When liquid chemicals are used, the chemical delivery module includes a liquid injection system or other appropriate mechanism (e.g. a bubbler or vaporizer) to vaporize the liquid. Vapor from the liquids may be mixed with a carrier gas.

Remote plasma system 826 can produce a plasma for selected applications, such as chamber cleaning or etching residue or defective layers from a process substrate. Plasma species produced in the remote plasma system 826 from precursors supplied via an input line are sent via a conduit 804D for dispersion through the showerhead assembly 804 to the processing region 808 in the MOCVD chamber 801. Precursor gases for a cleaning application may include chlorine containing gases, fluorine containing gases, iodine containing gases, bromine containing gases, nitrogen containing gases, and/or other suitable reactive elements. Remote plasma system 826 may also be adapted to deposit CVD layers by flowing appropriate deposition precursor gases into remote plasma system 826 during a layer deposition process. In one example, the remote plasma system 826 is used to deliver active nitrogen species to the processing region 808.

The temperature of the walls of the MOCVD chamber 801 and surrounding structures, such as the exhaust passageway, may be further controlled by circulating a heat-exchange liquid through channels (not shown) in the walls of the chamber to form a heat exchanger. The showerhead assembly 804 may also have heat exchanging passages (not shown) to form an additional heat exchanger. Typical heat-exchange fluids include water-based ethylene glycol mixtures, oil-based thermal transfer fluids, or similar fluids. The heating of the showerhead assembly 804 may be performed using additional heat exchanger(s) that can reduce or eliminate condensation of undesirable reactant products and improve the elimination of volatile products of the process gases and other contaminants that might contaminate the process if they were to condense on the walls of the exhaust conduit 806 and migrate back into the processing chamber during periods of no gas flow.

As briefly discussed above, FIG. 3 illustrates a processing sequence 300 used to form a high quality buffer layers and Group III-V layers that are used to form a useful semiconductor device, such as a power device, light emitting diode (LED), laser diode (LD) or other useful device. In one example, the processing sequence 300 shown in FIG. 3 is used to form one of more of the layers depicted in FIG. 2, which are discussed herein. While the processing sequence 300 is primarily discussed as being performed using the processing system 600, this system and the illustrated chamber configurations are not intended to be limiting as to the scope of the invention described herein. It should be noted that the number and sequence of steps illustrated in FIG. 3 are also not intended to limiting as to the scope of the invention described herein, since one or more steps can be added, deleted and/or reordered without deviating from the basic scope of the invention described herein.

At step 302, as shown in FIG. 3, a cluster tool, such as cluster tool 401 of the processing system 600, receives one or more substrates 201 for processing therein. In one embodiment, the substrates are delivered to a cluster tool in a wafer cassette that is configured to retain a plurality of substrates 201. In one configuration, step 302 also includes the process of removing the substrates from a wafer cassette and then transferring the substrates to a carrier loading module (e.g., referenced numeral 404A), so that the transferred substrates can then be positioned on a carrier 451. Once the carrier 451 has a desired number of substrates loaded thereon, one of the robots then transfer the carrier and substrates from the carrier loading module and load them into a load lock chamber of a cluster tool for processing. In some configurations of the processing sequence 300, step 302 further includes the steps of transferring the substrates into a load lock chamber 450, 452 (FIG. 4), reducing the pressure in the load lock chamber 450, 452 to a desirable pressure, and then receiving and transferring the substrates into a processing chamber that is adapted to perform step 304, which is discussed below.

Next, at step 304, a pretreatment process, or treatment, is performed on one or more of the substrates to remove any undesirable material from at least one surface of the substrates 201 prior to performing the process step 310, which is discussed below. In one embodiment, pretreatment of a substrate is performed to remove surface contamination (e.g., oxides, organic materials, other contaminants) and particles therefrom, as well as to prepare its surface for the reception of high quality buffer layers and Group III-V layers that have a high crystalline orientation in these highly crystalline structures. In one such embodiment, substrate pretreatment enables the deposition of high quality buffer layers and Group III-V layers with a surface roughness of less than approximately 1 nanometer (root mean square, based on AFM and (002) XRD FWHM<50 arcsec). Additionally, high process repeatability from run to run, wafer to wafer and high uniformity within the layer(s) formed on the substrate may also be achieved. In one embodiment, a substrate pretreatment is performed in-situ within one of the processing chambers 458-472 found in the cluster tool 401. In one configuration, the processing chambers 458-472 may include a SiCoNi™ or an Aktiv™ pre-clean chamber, which are both available from Applied Materials Inc. of Santa Clara, Calif.

In one embodiment, the pretreatment process(es) performed in step 304 includes loading the substrates 201 into a processing chamber (e.g., chamber 501) in the cluster tool 401 and then applying a bias (voltage) to the pedestal electrode (e.g., electrode 507) of the processing chamber to generate a plasma near the surface of the substrates. The generated plasma generally contains radicals and ions formed from a gas mixture comprising argon, nitrogen, hydrogen and/or other gases. The generated gas ions and radicals interact with and/or bombard the substrate surface to remove any substrate surface contamination and particles. In some cases, the plasma is used to modify the surface structure of the substrate to ensure a better crystal alignment between substrate and a deposited epitaxial film layers (e.g., AlN containing buffer). The plasma density, bias and treatment time can be adjusted to effectively treat, but not damage the substrate surface. In one example, a bias of approximately −5V to −1000V is applied for approximately 1 second to 15 minutes to an electrode disposed in a substrate support on which the substrates 201 and carrier 451 are disposed. The frequency of the power delivered to processing region of the processing chamber may vary from about 10 kHz to 100 MHz, and the power level may be between about 1 and 10 kW. The temperature of the substrate support surface during the pretreatment process step, or step 304, may range from between about −50 C to 1000° C. It is believed that the combination of the above pretreatment processes can be used to form a high quality buffer layer that can be repeatably formed from run-to-run and wafer-to-wafer. In one embodiment, use of the above described substrate pretreatment process reduces or eliminates variations in AlN and GaN crystal quality often observed in conventionally prepared substrates. In one configuration, step 304 is performed in one of the processing chambers 462, 464, which comprise a SiCoNi™ or Aktiv™ pre-clean chamber available from Applied Materials Inc., in the cluster tool 401 shown in FIG. 6.

In one embodiment of the processing sequence 300, at step 304, a wet cleaning process is performed to remove any undesirable material from the surfaces of the substrates 201 prior to performing the process step 302. In one embodiment, the clean process may be performed using a batch cleaning process in which the substrates are exposed to a cleaning solution. In one embodiment, the substrates are wetted by spraying, flooding, immersing of other suitable technique. The clean solution may be an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning solution.

Next, at step 306, the substrates 201 are degassed to remove any unwanted adsorbed water or other vaporizable contaminants from the surface of the substrates 201. In general, the degas process performed in step 306 will include heating the substrates 201 to a desired temperature while substrates are disposed within an environment that has a low partial pressure for the contaminants that are to be removed from the surface of the substrates. In one example, the substrates 201 are disposed in a vacuum environment or a high purity inert gas atmosphere. In yet another example, the substrates are heated to a temperature that is greater than about 100° C. in an environment that is maintained at a vacuum pressure of less than about 1 mTorr. In another example, the substrates are heated to a temperature that is greater than about 300° C. in an environment that is maintained at a vacuum pressure of less than about 10 Torr. In another example, the substrates are heated to a temperature that is as high as the processing temperature used in step 310 and a vacuum pressure less than or equal to the processing pressure used during step 310, which is discussed below. As illustrated in FIG. 3, in some embodiments, step 306 may be performed before or after step 304. In one configuration, step 306 is performed using a heated electrostatic chuck (not shown) that is disposed with the processing region of a degas chambers 458, 460 in the cluster tool 401 shown in FIG. 6. In one example, the substrate is thermally degassed in a rapid thermal processing (RTP) chamber at an elevated temperature in an environment that contains a desirable processing gas, such as an inert gas, $N_2$, HCl, HF, $NH_4F$, or $H_2$, and/or combinations thereof.

Next, at step 308, the substrates 201 are optionally preheated to a desirable temperature before step 310 is performed on the substrates 201. In general, the preheat process performed in step 308 will include heating the substrates 201 to a temperature near the processing temperature used during step 310. In some configurations, step 308 may be performed in one of the processing chambers 454-472 in the processing system 600 other than the processing chamber in which step 310 is performed.

Next the substrates 201 are transported to one of the processing chambers 466-472 in which step 310, or a buffer layer formation step, is used to deposit a high quality PVD deposited buffer layer 213 on a surface of the substrates 201. In one embodiment, the processing chamber 466, 468, 470, 472 is a physical vapor deposition chamber similar to the processing chamber 500 illustrated in FIG. 5. The processes described herein can be used to form an epitaxially grown AlN buffer that is formed by a PVD process. The processes described herein have been used to reduce the film stress, eliminate film cracking and improve the structural quality of the PVD deposited AlN films at moderate processing temperatures. The PVD deposition processes described herein are believed to have significant advantages over conventional MOCVD or HVPE buffer layer formation processes, since it allows a high quality epitaxial layer (e.g., GaN) to be formed or grown at a much lower cost and a faster rate by reducing the need for MOCVD chamber conditioning steps, the need for temperature ramping between process steps and the need for excessive cleaning processes. In one such embodiment, using a combination of the processes described herein, a PVD AlN film is deposited that has a smooth surface (e.g., 0.5 nanometers, RMS) and has a high material quality (FWHM of (002) peak~50 arcsec) at a thickness of approximately 40 nanometers. In one example, the PVD deposited AlN film's roughness is less than about 3% of the thickness of the deposited layer on a silicon substrate, while also achieving a FWHM of the (002) peak of less than 3600 arcsec. In another example, the PVD deposited AlN film's roughness is less than about 1 nm on a sapphire substrate, while also achieving a FWHM of the (002) peak of less than 200 arcsec. In a specific embodiment, a high-quality GaN film (FWHM of (002)<200 arcsec and (102)<300 arcsec) can then be formed on the deposited PVD deposited buffer layer 213. Therefore, the need for the often time consuming and complicated MOCVD GaN buffer layer is thus eliminated.

In one example, the PVD chamber is adapted to perform a non-reactive sputtering process that forms an aluminum nitride layer at a low or slightly elevated temperature in the range of about 20 to about 200° C. In another example, the processing chamber is adapted to perform a non-reactive sputtering process that forms an aluminum nitride layer at a high temperature approximately in the range of 200-1200° C.

In another embodiment, the buffer layer 213 is formed by use of a reactive sputtering process that is performed in a processing chamber that is similar to the processing chamber 500, which is discussed above. In one embodiment, the AlN containing buffer layer 213 is formed using a substantially pure aluminum target that is sputtered using a plasma that comprises an inert gas (e.g., argon) and a nitrogen containing gas. In one embodiment, after one or more epitaxy-ready substrates are loaded into a processing chamber 500, a continuous AlN film is deposited thereon using an Al-containing target and a nitrogen-containing process gas. In one example, the target may be formed from a material selected from the group of, but is not limited to, a substantially pure aluminum, an aluminum containing alloy, an aluminum containing compound, such as AlN, AlGa, $Al_2O_3$, etc., and an aluminum containing target that is doped with group II/IV/VI elements to improve layer compatibility and device performance. The process gas used during the sputtering process may include, but is not limited to, a nitrogen containing gas, such as nitrogen ($N_2$), ammonia ($NH_3$), nitrogen dioxide ($NO_2$), nitric oxide (NO), etc. and an inert gas such as argon (Ar), neon (Ne), krypton (Kr), etc. In one embodiment, dopant atoms may be added to the deposited film through the use of a doped target material and/or delivery of a dopant gas into the generated sputtering plasma to adjust the electrical, mechanical, and optical properties of the deposited PVD AlN buffer layer, for example, to render the film suitable for fabricating Group III-nitride devices thereon. In one embodiment, the thickness of the AlN buffer layer is between about 1 and about 1000 nanometer (nm).

In one embodiment, during step 310, the power source 593 is configured to deliver RF power to the target 503 and processing region 540 at a power level in the range of 0-20 kW and at a frequency between about zero and about 60 MHz. In yet another embodiment, the power source 593 is configured to deliver a pulsed DC power signal to the target 503 within a range of 0-50 kW at a pulse frequency between about 1 and about 500 KHz and at a duty cycle in the range of between about 1 and about 99%. In one example, the power source 593 is configured to deliver a pulsed DC power signal to the target 503 within a range of 0-50 kW at a pulse frequency between about 1 and about 500 KHz and at a duty cycle in the range of between about 40 and about 99%. In another embodiment, the power source 593 is configured to deliver a constant DC power signal within a power range of 0-50 kW. In yet, another embodiment, the power source 593 is configured to deliver a combination of at least two waveforms selected from a group consisting of pulsed DC, pulsed RF, constant RF and constant DC power. In one configuration of step 310, a starting sequence is used to deposit the AlN buffer layer that includes turning on an RF power supply first, turning on DC power supply first, or turning on RF and DC simultaneously at the start of the process recipe steps performed in step 310. In some configurations, the initiation of the flow of a nitrogen containing gas may be performed prior to, after, or at the same time the power supply is turned on. In some configurations, the process termination portion of step 310 includes turning the RF power supply off first, (pulsed) DC power supply off first, or RF and DC turned off simultaneously, with process gas turn off performed prior to, at the same time, or after the power supply is off to control surface morphology, stoichiometry and type of AlN growth (e.g., N-face growth).

In some embodiments, a capacitor tuner (not shown) that is connected to the pedestal electrode 532 and power source 530 is adjusted to alter the processed substrates' floating potential, change the gas ionization ratio, plasma energy and mobility of reactants in the processing region of the processing chamber. The capacitor tuner is also adapted to control the film stress, improve the surface morphology and crystal quality of the deposited buffer layer and/or increase deposition rate. In one example, the capacitor tuner is adjusted so that a bias between about −1000 volts and about +500 Volts is applied to the substrate support assembly 513. In some configurations, a heated substrate support, such as an electrostatic chuck 512, is used to control the substrates' surface temperature and their thermal uniformity, which may range from between about 200 and about 550° C., 550-1000° C., and 1000-1401° C. The deposition process may be performed at a pressure between about 0.1 and about 200 mTorr. The deposition rate of the PVD deposited AlN buffer layer is between about 0.2 angstroms per second (Å/s) and about 20 (Å/s).

In one embodiment of step 310, a plasma is formed over the surface of the substrates 201 that are disposed on the substrate support assembly 513, prior to biasing the target 503, by RF biasing the pedestal electrode 532. In one configuration, the formed plasma comprises a substantially pure nitrogen containing plasma, or a plasma that has a nitrogen concentration equal to or greater than the nitrogen concentration of the plasma formed during the AlN deposition part of step 310. It is believed that exposing substrates that comprise sapphire to an in-situ nitrogen plasma prior to forming the AlN layer promotes the formation of a high quality AlN film thereon. In one embodiment, the in-situ plasma is formed by RF biasing the pedestal electrode 532 to form a potential of between 5 and 500 volts for a period of time, such as 1 to 10 seconds, before a bias is applied to the target 503.

In one configuration, the processes performed during step 310 may include stress engineering the deposited film to achieve a film with a targeted compressive or tensile stress in a range of between −10 Gpa and about 10 GPa. The film stress may be adjusted by controlling the processing temperature, deposition rate, power delivered to the target, processing pressure, gas flow rate and substrate bias during one or more phases of the deposition process. Further, in some configurations, the PVD process variables are adjusted to deposit an AlN buffer layer that has a density approximately in the range of 70%-100%. The deposited PVD AlN film may also be formed as a single layer, multiple layers, or multiple pairs of alternating layers with different composition or properties fabricated throughout the processes performed during step 310 mentioned herein.

Figure 9A:
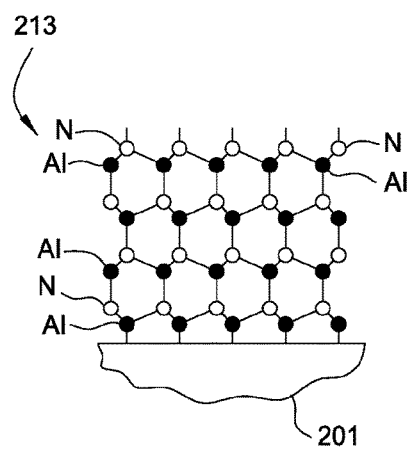
FIG. 9A is side cross-sectional view of portion of a buffer layer formed on a surface of a substrate in accordance with one embodiment of the present invention.
Figure 9B:
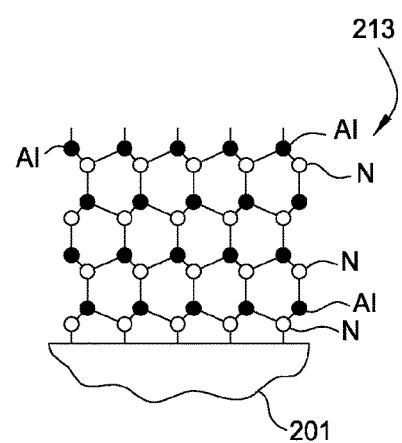
FIG. 9B is side cross-sectional view of portion of a buffer layer formed on a surface of a substrate in accordance with one embodiment of the present invention.

In some embodiments, the sputtering power, substrate bias, gas flow, pressure, temperature, and the gas composition (e.g., group III/V ratio) are adjusted to render the surface of the growing film so that it is terminated with nitrogen atoms, which has been found to promote improved crystal defect quality and promote the vertical and/or lateral growth of the high quality buffer layer 213. FIGS. 9A-9B are schematic views of a surface of a substrate 201 that each have different types of a high quality AlN buffer layer formed thereon. FIG. 9A illustrates a portion of a substrate 201 that contains a nitrogen-face, or N-face, growth of a crystalline AlN containing layer that is deposited on a surface of a substrate, such as a silicon containing surface (e.g., <111> or <110> oriented surface), by adjusting the step 310 processing parameters during a reactive type AlN PVD deposition process. FIG. 9B illustrates a portion of a substrate 201 that contains an aluminum-face, or Al-face, growth of a crystalline AlN containing layer that is deposited on a surface of a substrate, such as a silicon containing surface (e.g., <111> or <110> oriented surface), by adjusting the step 310 processing parameters during the reactive type AlN PVD deposition process. Growth of layers that primarily have a nitrogen termination at its exposed surface will be referred to herein as N-face growth layers. It is believed that by delivering an RF, a pulsed RF or a low power pulsed DC bias (e.g., <2 kW) signal to the target 503 will promote the growth of an N-face type AlN buffer layer. While the delivery of a high power pulsed DC and constant DC power signal to the target will promote the formation and growth of layers that have an aluminum termination at its exposed surface, which is referred to herein as Al-face growth of an AlN buffer layer. It has been found that adjusting the substrate floating potential during the deposition process can be used to adjust the type of growth, e.g., N-face or Al-face growth, of the deposited AlN buffer layer. In one example, forming a substrate potential between about 5 volts and about 500 volts can be used to reliably form an N-face type AlN buffer layer using a 2 kW RF PVD process, and a substrate potential between about −300 volts and about −1 volts will reliably form an Al-face type AlN buffer layer using a 6 kW pulsed DC PVD process. Also, it has been found that etching the surface of the deposited AlN layer using a potassium hydroxide (KOH) wet chemistry (e.g., 5 molar aqueous KOH solution) the type of growth of the deposited film can be determined, since an Al-face growth will remain relatively un-etched in this chemistry (e.g., >30 seconds), while an N-face growth film will be rapidly etched away (e.g., 500 Å in <30 seconds).

Further, it has been found that deposition rate has an effect on the ability to form Al-face versus N-face aluminum nitride film. In one example, Al-face growth is promoted by adjusting the process variables (e.g., power, pressure) to deliver a deposition rate of >7 Å/second and N-face growth is promoted by adjusting the process variables to deliver a deposition rate of <2 Å/second.

It is also believed that by the controlling the chamber conditioning and impurity incorporation into the growing buffer layer 213, an N-face or Al-face growth can be repeatably and reliably formed. Thus, it is believed, and it has been found, that the processes performed during steps 304 and 306, in combination with the processes performed during step 310, affect the N-face or Al-face growth of the deposited AlN buffer layer. The preferential growth of an Al-face or an N-face deposited AlN buffer layer has been found to affect the various growth-modes of the subsequently deposited layers discussed below (e.g., steps 312-314). The growth mode of the subsequently deposited layer (s) can affect their physical, chemical and electrical surface and bulk properties. In some cases, the N-face or Al-face type PVD deposited AlN buffer layer 213 on a substrate surface is used to promote a three dimensional (3-D) growth (e.g., favors island type growth) of the subsequently deposited layer (e.g., GaN) thereon. While in other cases, the N-face or Al-face type deposited AlN buffer layer 213 on a substrate surface is used to promote a two dimensional (2-D) growth (e.g., favors rapid coalescence of the initially formed nuclei and then forms a smooth surface as it grows) of the subsequently deposited film (e.g., GaN) thereon. In one example, Al-face growth is preferable when forming a high quality GaN layer on the PVD deposited AlN buffer layer 213 when forming an LED device. It has been found that a high quality Ga-face GaN can be formed using an Al-face growth of an AlN buffer layer. In this case, the Al-face growth provides desirable film morphology and crystalline defect density on silicon and sapphire substrates. It is believed that N-face growth may be preferable when forming a high quality GaN layer on the PVD deposited AlN buffer layer 213 in certain types of power devices.

In one example, an N-face AlN buffer layer was formed by delivering an RF plus DC power signal to the target that comprises delivering 1500-2500 kWatts of RF power and 1500-2500 kWatts of DC power, controlling the processing pressure of 15-25 mTorr, adjusting the argon to nitrogen gas composition ratio of 30-60% $N_2$ in the processing region and controlling the substrates' temperature to about 450-550° C. to achieve a deposition rate of about <0.5 Å/sec.

Alternately, in one example, an Al-face type AlN buffer layer was formed by delivering a pulsed DC power signal to the target that comprises 4-6 kW at a pulse frequency of about 5-200 kHz and at a duty cycle in the range of 80-95% controlling the processing pressure of <10 mTorr, adjusting the argon to nitrogen gas composition ratio of 60-95% in the processing region and controlling the substrates' temperature to about 350-450° C. to achieve a deposition rate of about >7 Å/sec.

In one embodiment of step 310, an additional in-situ and/or ex-situ post processing treatment including a thermal treatment (RTP, laser annealing, high temperature bake, etc.) or chemical treatment (solution based, gas based, etc.) is used to improve the properties of the deposited buffer layer. It may be the case that regardless of deposition temperature, a PVD deposited aluminum nitride layer suitable for inclusion in a device, such as device 200, may need to be, at some point, exposed to a high temperature approximately in the range of 401-1401° C. (e.g., about 900° C.), in order to achieve the requisite material properties (e.g., appropriate defect density, crystal grain size, crystal orientation, stress, etc.). In accordance with an embodiment of the present invention, a rapid thermal processing (RTP) process is performed on the PVD deposited aluminum nitride buffer layer prior to fabrication of additional layers on the aluminum nitride layer. An RTP chamber, which is available from Applied Materials Inc., may be disposed in one of the processing chamber contained in the cluster tools 401 and 601, which are discussed above. In one example, however, an RTP process is performed in the PVD chamber. In another example, a laser annealing capability is associated with the above described fabrication process for device 200.

In another embodiment, prior to performing step 310, a pre-seeding layer, which may be composed of Al, AlOx, SiNx, ZnO, ZnS, ZrN, TiN, etc. is deposited on the surface of the substrates to protect the substrate surface, and enable the deposition of a higher quality AlN and/or allow a fast deposition rate to be used during the PVD AlN buffer layer deposition process without affecting its film quality. In one example, the pre-seeding layer may be formed by sputtering a portion of a poisoned Al containing target without flowing a nitrogen-containing gas and/or using a reduced power, pressure or gas flow.

Next, at step 312, one or more device layers, such as layers 214 and 216, are deposited over the formed buffer layer 213 using an MOCVD or HVPE deposition process using one of the processing chambers 602a-602c, which are disposed in the cluster tool 601 found in the processing system 600. In one example, layer 214 is a group III-nitride layer (e.g., AlN, InN, GaN, AlGaN, InGaN or InAlGaN layer) that is deposited in processing chamber 602a using an MOCVD process, and layer 216 is another group III-nitride layer (e.g., AlGaN layer) that is deposited in processing chamber 602b using an MOCVD process. In one example, layer 214 generally includes an undoped GaN (u-GaN) layer and/or an n-doped (n-GaN) layer that are sequentially deposited on the buffer layer 213. In the case where an MOCVD process is used to deposit Group III-nitride layers, precursor gases such as tri-methylgallium (TMG), ammonia ($NH_3$), and nitrogen ($N_2$) may be introduced into the processing chamber, while the substrates 201 disposed on the carrier 451 are heated and maintained at a processing temperature of about 950° C. to about 1050° C. and the chamber pressure is maintained at a pressure of about 50 Torr to about 600 Torr. The u-GaN layer may be deposited to a thickness of about 1 μm to about 100 μm, and/or the n-GaN layer may be deposited to a thickness of between about 2 μm and about 140 μm. In one example, the u-GaN/n-GaN layer is deposited to a total thickness of about 4 μm. In some embodiments, the u-GaN layer may be omitted. Examples of other GaN and AlGaN deposition processes that may be used to form part of the device 200 are further described in U.S. patent application Ser. No. 13/052,861, filed Mar. 21, 2011, entitled "Forming A Compound-Nitride Structure That Includes A Nucleation Layer," which is incorporated by reference in its entirety.

Next, at step 314, one or more contact layers, such as the first power electrode 218, second power electrode 220 and/or the gate structure 222 are deposited over the formed device layers formed during step 312. In one embodiment, the contact layers are formed by use of a PVD deposition process, which is performed in one of the processing chambers 466-472 in the cluster tool 401 found in the processing system 600. In one embodiment, the first power electrode 218, second power electrode 220 and/or the gate structure 222 comprise a conductive layer that are formed using a PVD deposition process. In one embodiment, the conductive metal layer comprises a metal selected from the group consisting of silver (Ag), gold (Au), palladium (Pd) aluminum (Al), tungsten (W), platinum (Pt), indium (In), zinc (Zn) and titanium (Ti), combinations thereof, or other useful conductive metal. In some embodiments of step 314, after depositing one or more blanket conductive layers using a PVD deposition process the layers are patterned using conventional lithographic and etch techniques.

While the foregoing is directed to embodiments of the present invention, other and further embodiments of the invention may be devised without departing from the basic scope thereof, and the scope thereof is determined by the claims that follow.

What is claimed is:

1. A method for fabricating a device, comprising:
   treating a surface of one or more substrates in a first processing chamber;
   transferring the one or more substrates from the first processing chamber to a second processing chamber in a controlled environment; and depositing a crystalline aluminum-nitride layer on the one or more substrates in the second processing chamber that has one or more walls that define a processing region, wherein depositing the crystalline aluminum-nitride layer comprises:
   biasing a target that has a surface that is in contact with the processing region, wherein biasing the target comprises delivering a pulsed DC signal at a power of between 4 kWatts and 6 kWatts, and wherein the target comprises aluminum;
   flowing a first gas that comprises nitrogen into the processing region;
   flowing a second gas into the processing region, wherein the second gas comprises argon, krypton or neon;
   biasing an electrode to form a negative substrate bias potential on the one or more substrates that are disposed over a substrate support, wherein biasing the electrode comprises creating a floating potential on the one or more substrates that varies from between −300 volts and −1 volt, wherein biasing the electrode comprises biasing the electrode for a first period of time that occurs before biasing the target;
transferring the one or more substrates from the second processing chamber to a third processing chamber; and
forming a group III-nitride layer on the crystalline aluminum nitride layer in the third processing chamber, wherein the crystalline aluminum-nitride layer has a surface roughness less than three percent of a thickness of the crystalline aluminum-nitride layer, and wherein forming the group III-nitride layer comprises:
   delivering a metal containing precursor and a nitrogen containing gas to a surface of each of the one or more substrates.

2. The method of claim 1, wherein delivering the pulsed DC signal comprises delivering the pulsed DC signal at a pulse frequency of between 5 kHz and 200 kHz.

3. The method of claim 1, wherein delivering the pulsed DC signal at the power of between 4 kWatts and 6 kWatts is at a duty cycle between 80% and 95%.

4. A method for fabricating a device, comprising:
treating a surface of one or more substrates in a first processing chamber, wherein treating the surface of the one or more substrates comprises degassing the one or more substrates or sputter etching a surface of the one or more substrates;
transferring the one or more substrates from the first processing chamber to a second processing chamber in a controlled environment;
heating the one or more substrates to a temperature between 200° C. and 1000° C. before biasing the target;
controlling a pressure within the processing region while biasing the target to a pressure between 0.1 mTorr and 200 mTorr; and
depositing the crystalline aluminum nitride layer at a deposition rate between 7 angstroms per second and 20 angstroms per second, wherein the processing chamber has one or more walls that define a processing region, and wherein depositing the crystalline aluminum-nitride layer comprises:
   biasing a target that has a surface that is in contact with the processing region, wherein biasing the target comprises delivering a pulsed DC signal and the target comprises aluminum, wherein biasing the target comprises delivering a pulsed DC signal at a power between 4 kWatts and 6 kWatts, flowing a first gas that comprises nitrogen into the processing region;
   flowing a second gas into the processing region, wherein the second gas comprises argon, krypton or neon; and
   biasing an electrode to form a negative substrate bias potential on the one or more substrates that are disposed over a substrate support, wherein biasing the electrode comprises creating a floating potential on the one or more substrates that varies from between −300 volts and −1 volt.

5. The method of claim 4, wherein biasing the electrode occurs between 1 and 10 seconds before biasing the target.

6. The method of claim 4, wherein the pressure within the processing region is less than 10 mTorr.

7. The method of claim 6, further comprising adjusting the argon to nitrogen gas composition ratio of 60% to 95% $N_2$ in the processing region.

8. The method of claim 7, wherein the temperature of the one or more substrates is heated to a temperature between 350° C. and 450° C.

9. The method of claim 4, wherein delivering the pulsed DC signal is performed using a duty cycle of between 80% and 95%.

10. The method of claim 9, wherein delivering the pulsed DC signal is performed at a pulse frequency of between 5 kHz and 200 kHz.

11. The method of claim 10, further comprising adjusting the argon to nitrogen gas composition ratio of 60% to 95% $N_2$ in the processing region.

12. The method of claim 4, wherein the first gas is selected from the group consisting of nitrogen dioxide ($NO_2$) and nitric oxide (NO).

13. The method of claim 4, wherein the pulsed DC signal applied to the target includes a signal that comprises a plurality of alternating first and second intervals, wherein during the first intervals a first negative DC bias voltage is applied to the target, and during the second intervals a DC bias voltage that is less negative than the first negative DC bias voltage is applied to the target.

14. The method of claim 13, wherein the DC bias voltage applied to the target during the second intervals is a positive voltage.

15. The method of claim 13, wherein biasing the electrode occurs between 1 and 10 seconds before biasing the target.

16. The method of claim 1, wherein the crystalline aluminum-nitride layer having Al polarity has a stress between about 10 Gpa and about 10 Gpa.

* * * * *